US012586645B2

(12) United States Patent
Kavala et al.

(10) Patent No.: US 12,586,645 B2
(45) Date of Patent: Mar. 24, 2026

(54) MEMORY SYSTEM, OPERATING METHOD OF THE MEMORY SYSTEM, AND INTERFACE CIRCUIT OF THE MEMORY SYSTEM

(71) Applicant: Samsung Electronics Co., Ltd., Suwon-si (KR)

(72) Inventors: Anil Kavala, Suwon-si (KR); Youngmin Jo, Suwon-si (KR); Jungjune Park, Suwon-si (KR); Chiweon Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 228 days.

(21) Appl. No.: 18/444,848

(22) Filed: Feb. 19, 2024

(65) Prior Publication Data
US 2024/0282378 A1 Aug. 22, 2024

(30) Foreign Application Priority Data
Feb. 21, 2023 (KR) ........................ 10-2023-0023151

(51) Int. Cl.
*G11C 16/08* (2006.01)
*G11C 16/04* (2006.01)
(52) U.S. Cl.
CPC .......... *G11C 16/08* (2013.01); *G11C 16/0483* (2013.01)
(58) Field of Classification Search
CPC . G11C 16/08; G11C 16/0483; G11C 11/4096; G11C 16/32; G11C 7/1078; G11C 7/222; G06F 3/0688; H03K 5/1565
See application file for complete search history.

(56) References Cited

U.S. PATENT DOCUMENTS

| | | | |
|---|---|---|---|
| 10,191,797 B2 * | 1/2019 | Lee ........................ | G11C 7/222 |
| 10,482,935 B2 | 11/2019 | Park et al. | |
| 10,923,175 B2 | 2/2021 | Moon et al. | |
| 10,951,198 B1 * | 3/2021 | Lijima ................ | G06F 13/1689 |
| 11,244,711 B2 | 2/2022 | Tsuji | |
| 11,372,786 B2 * | 6/2022 | Ootomo ............. | G06F 13/4027 |
| 2013/0250693 A1 * | 9/2013 | Shimizu ................ | G11C 16/32 365/185.18 |
| 2018/0350414 A1 * | 12/2018 | Park ........................ | G11C 7/222 |
| 2020/0302982 A1 * | 9/2020 | Koh .................... | G06F 13/1689 |

(Continued)

*Primary Examiner* — Amir Zarabian
*Assistant Examiner* — Bradley S Coon
(74) *Attorney, Agent, or Firm* — Wolf, Greenfield & Sacks, P.C.

(57) ABSTRACT

A memory system includes a memory device having a plurality of non-volatile memories, a buffer chip connected with each of the plurality of non-volatile memories, and a memory controller connected with the buffer chip and configured to provide a data strobe signal and a data signal to the buffer chip. The buffer chip includes a first loop coupled to a sampler circuit and configured to perform first monitoring on the data strobe signal and first duty correction on the data strobe signal based on the first monitoring, and a second loop coupled to a multiplexer and configured to, responsive to the first duty correction, perform second monitoring on the data strobe signal and second duty correction on the data strobe signal based on the second monitoring. The buffer chip is configured to store first and second duty correction information for at least one of the plurality of non-volatile memories.

20 Claims, 19 Drawing Sheets

(56) References Cited

U.S. PATENT DOCUMENTS

| 2022/0052678 A1* | 2/2022 | Choi ..................... G11C 7/222 |
| 2022/0122675 A1 | 4/2022 | Kim et al. |
| 2022/0230666 A1 | 7/2022 | Kim et al. |

* cited by examiner

STACK OF MEMORY DEVICES

FIG. 5

BLKi

FIG. 15

MEMORY SYSTEM, OPERATING METHOD OF THE MEMORY SYSTEM, AND INTERFACE CIRCUIT OF THE MEMORY SYSTEM

CROSS-REFERENCE TO RELATED APPLICATION

This application is based on and claims priority under 35 U.S.C. § 119 to Korean Patent Application No. 10-2023-0023151, filed on Feb. 21, 2023, in the Korean Intellectual Property Office, the disclosure of which is incorporated by reference herein in its entirety.

The inventive concept relates to a memory system, an operating method of the memory system, and an interface circuit of the memory system, and more particularly, to a memory system which uses a buffer chip as a host and an interface circuit of a memory device.

BACKGROUND

Memory devices may operate based on various specifications, and in non-volatile memories, memory devices may be implemented as a type having a three-dimensional (3D) structure. In 3D memory devices, as stacked layers of a 3D memory cell array increase, clocks for transferring data may have a difference (e.g. may not be synchronized) for each memory cell of memory devices.

In two-dimensional (2D) memory devices, although a duty of a data clock may be selected or optimized for each memory cell, when data is transferred based on a uniform data clock, there may be challenges with respect to time and cost in performing a compensation operation on a data clock.

SUMMARY

The inventive concept, as implemented by embodiments described herein, is for providing a clock signal, on which optimized duty correction has been performed, to one of a plurality of memory cells.

A memory system according to an embodiment may include a memory device, which includes a plurality of non-volatile memories, a buffer chip connected with each of the plurality of non-volatile memories, and a memory controller which is connected with the buffer chip and is configured to transfer and receive a data strobe signal and a data signal.

A buffer chip according to an embodiment may include a first loop coupled to a sampler circuit and configured to perform first monitoring on the data strobe signal and perform first duty correction on the data strobe signal based on the first monitoring, and a second loop coupled to a multiplexer and configured to, responsive to completing the first duty correction, perform second monitoring on the data strobe signal and perform second duty correction on the data strobe signal based on the second monitoring. The buffer chip is configured to store first duty correction information and second duty correction information for or about at least one of the plurality of non-volatile memories based on the first duty correction and the second duty correction, respectively.

According to another aspect of the inventive concept, there is provided an operating method of a memory system including a buffer chip connected with each of a plurality of non-volatile memories included in a memory device and a memory controller connected with the buffer chip and configured to transfer and receive a data strobe signal and a data signal to and from the buffer chip, the operating method including performing first monitoring on the data strobe signal and performing first duty correction on the data strobe signal based on the first monitoring, performing second monitoring on the data strobe signal and performing second duty correction on the data strobe signal responsive to completing the first duty correction based on the second monitoring, and storing first duty correction information and second duty correction information for or about at least one of the plurality of non-volatile memories based on the first duty correction and the second duty correction, respectively.

According to another aspect of the inventive concept, there is provided an interface circuit of a memory system, configured to connect a memory device including a plurality of non-volatile memories with a memory controller that is configured to transfer and receive a data strobe signal and a data signal to and from the memory device. The interface circuit includes a first loop configured to perform first monitoring on the data strobe signal and perform first duty correction on the data strobe signal based on the first monitoring, and a second loop configured to, responsive to completing the first duty correction, perform second monitoring on the data strobe signal and perform second duty correction on the data strobe signal based on the second monitoring result. The first loop is configured to be coupled to a data signal sampler included in a buffer chip, and the second loop configured to be coupled to a multiplexer of the buffer chip. The interface circuit is configured to store first duty correction information and second duty correction information for or about at least one of the plurality of non-volatile memories based on the first duty correction and the second duty correction, respectively.

BRIEF DESCRIPTION OF THE DRAWINGS

Embodiments will be more clearly understood from the following detailed description taken in conjunction with the accompanying drawings in which:

FIG. 5 is a block diagram for describing a configuration of a second loop according to an embodiment;

FIGS. 13, 14, and 15 are diagrams for describing a three-dimensional (3D) V-NAND structure applicable to a memory device according to an embodiment;

DETAILED DESCRIPTION OF EMBODIMENTS

Terms used herein will be briefly described, and embodiments will be described in detail. The terms "comprises," "comprising," "includes" and/or "including," when used herein, specify the presence of stated elements, but do not preclude the presence of additional elements. The term "and/or" includes any and all combinations of one or more of the associated listed items.

Figure 1:
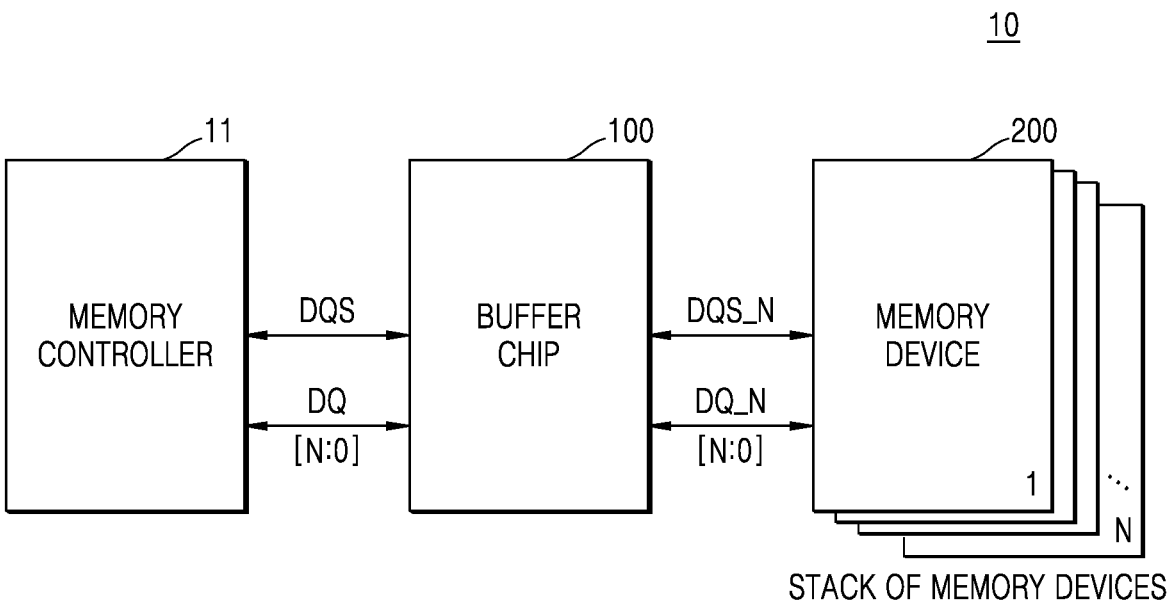
FIG. 1 is a block diagram of a memory system according to an embodiment.

FIG. 1 is a block diagram of a memory system 10 according to an embodiment.

Referring to FIG. 1, the memory system 10 according to an embodiment may include a memory controller 11 and a buffer chip 100 or a memory device 200.

The memory controller 11 according to an embodiment may be connected with the buffer chip 100 and may transfer and receive a data strobe signal DQS or a data signal DQ. As used herein, elements that are "connected" or "connected with" one another may be electrically coupled so as to allow transmission/reception of electrical signals therebetween. The memory controller 11 according to an embodiment may include a host (not shown) of the memory system 10. The memory controller 11 according to an embodiment may generate the data strobe signal DQS or the data signal DQ and may transfer the data strobe signal DQS or the data signal DQ to the buffer chip 100, so as to perform a write or read operation on the memory device 200. Also, the memory controller 11 according to an embodiment may generate a plurality of instructions or request signals for controlling the memory device 200 and may transfer the instructions or the request signals to the memory device 200. The data signal DQ according to an embodiment may be provided through N number of pins.

The buffer chip 100 according to an embodiment may connect the memory controller 11 with the memory device 200. The buffer chip 100 according to an embodiment may be an interface circuit. For example, the buffer chip 100 may receive the data strobe signal DQS or the data signal DQ from the memory controller 11, correct the received data strobe signal DQS or data signal DQ, and transfer a corrected data strobe signal DQS_N or a corrected data signal DQ_N to the memory device 200. The corrected data signal DQ_N according to an embodiment may be provided through N number of pins.

The buffer chip 100 according to an embodiment may include or may be configured to perform a plurality of loops so as to correct the data strobe signal DQS or the data signal DQ, and an operation of correcting the data strobe signal DQS or the data signal DQ by using the buffer chip 100 is described in detail with reference to FIGS. 2 to 7.

The memory device 200 according to an embodiment may include a plurality of non-volatile memories and may be connected with the buffer chip 100 connected with each of the plurality of non-volatile memories. The memory device 200 according to an embodiment may include a solid state drive (SSD) device. However, the memory device 200 is not limited thereto and may be configured with a plurality of non-volatile memory devices or volatile memory devices.

For example, the memory device 200 may include a non-volatile memory device such as NAND flash memory, vertical NAND (V-NAND) flash memory, NOR flash memory, resistive random access memory (RAM) (RRAM), phase-change memory, or magnetoresistive RAM (MRAM). The memory device 200 according to an embodiment may be implemented as a volatile memory such as dynamic RAM (DRAM), static RAM (SRAM), PRAM, ferroelectric RAM (FRAM), RRAM, and/or MRAM.

Figure 2:
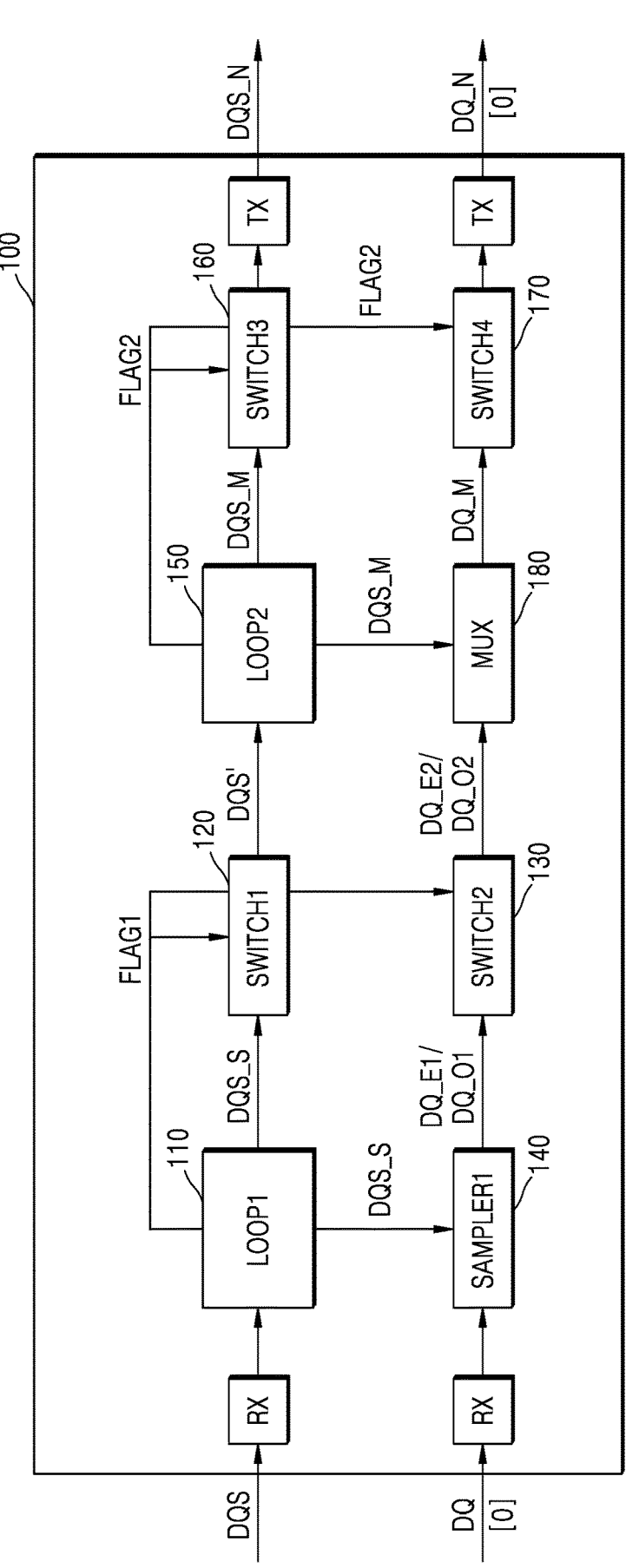
FIG. 2 is a block diagram for describing a configuration of a buffer chip of a memory system according to an embodiment.

FIG. 2 is a block diagram for describing a configuration of the buffer chip 100 of the memory system 10 according to an embodiment.

Referring to FIG. 2, the buffer chip 100 according to an embodiment may include a plurality of reception terminals RX and a plurality of transfer terminals TX and may receive a data strobe signal DQS or a data signal DQ through one of the plurality of reception terminals RX. Also, the buffer chip 100 according to an embodiment may correct the received data strobe signal DQS or data signal DQ and may transfer a corrected data strobe signal DQS_N or a corrected data signal DQ_N to the memory device 200.

The buffer chip 100 according to an embodiment may include a first loop 110, a first switch 120, a second switch 130, and/or a first sampler 140, so as to perform correction on the data strobe signal DQS and/or the data signal DQ. Also, the buffer chip 100 according to an embodiment may include a second loop 150, a third switch 160, a fourth switch 170, and/or a multiplexer 180, so as to perform correction on the data strobe signal DQS and/or the data signal DQ. The first loop 110 according to an embodiment may be a loop which first performs duty correction on the received data strobe signal DQS, and the second loop 150 may be a loop which operates when an operation of the first loop 110 is completed. The terms "first," "second," etc., may be used herein merely to distinguish one component or element from another.

The first loop 110 according to an embodiment may perform first monitoring on the data strobe signal DQS and may perform first duty correction on the data strobe signal DQS, based on a first monitoring result. The first monitoring according to an embodiment may be an operation which monitors a duty (also referred to as a duty cycle) of the data strobe signal DQS in the first loop 110, and the first duty correction may be an operation of performing duty correction on the data strobe signal DQS in the first loop 110. For example, the first loop 110 according to an embodiment may be disposed at an inlet of or to provide an input to the first sampler 140 which corresponds to a data signal and is included in the buffer chip 100 and may perform duty correction on the data strobe signal DQS received from the memory controller 11.

The first loop 110 according to an embodiment may be configured so that the first switch 120 is connected with the second switch 130 when the first duty correction is completed. Also, the first loop 110 according to an embodiment may perform the first duty correction on the data strobe signal DQS and may store first duty correction information obtained as a result of the performance. A configuration of the first loop 110 is described below in detail with reference to FIG. 4.

The first switch 120 according to an embodiment may be operable to connect the first loop 110 with the second loop 150 and may control a flow of the data strobe signal DQS. For example, when the first duty correction is completed in the first loop 110, the first loop 110 may generate a first flag signal Flag1 and the first switch 120 may be changed to a closed state responsive to the first flag signal Flag1. The first flag signal Flag1 according to an embodiment may be a signal representing that the first duty correction is completed. When the first switch 120 according to an embodiment is changed to a closed state, the data strobe signal DQS on which the first duty correction has been performed may be transferred to the second loop 150.

The second switch 130 according to an embodiment may be operable to connect the first sampler 140 with the multiplexer 180 on the data signal DQ and may control a flow of the data signal DQ. For example, when the first duty correction is completed in the first loop 110, the second switch 130 may be changed to a closed state (e.g., responsive to the first flag signal Flag1) and may transfer the data signal DQ to the multiplexer 180.

The first sampler 140 according to an embodiment may divide the data signal DQ into a first data signal DQ_E1 and a second data signal DQ_O1 and may transfer a divided first data signal DQ_E2 and a divided second data signal DQ_O2 to the multiplexer 180. For example, the first sampler 140 may transfer the divided first data signal DQ_E2 and the divided second data signal DQ_O2 to the multiplexer 180 through the second switch 130. When the first duty correction on the data strobe signal DQS is completed in the first loop 110, the second switch 130 according to an embodiment may be closed, and the first sampler 140 may transfer the divided first data signal DQ_E2 and the divided second data signal DQ_O2 to the multiplexer 180.

The first sampler 140 according to an embodiment may denote a sampler which is included in the buffer chip 100. The first sampler 140 may divide the received data signal DQ. For example, when the received data signal DQ has a frequency of about 4.8 GHZ, each of the first data signal DQ_E1 and the second data signal DQ_O1 may be deserialized to have a frequency of about 2.4 GHZ.

When the first duty correction is completed, the second loop 150 according to an embodiment may perform second monitoring on a data strobe signal DQS_S passing through the first switch 120 and may perform second duty correction on the data strobe signal DQS_S on which the first duty correction has been performed, based on a second monitoring result. The second monitoring according to an embodiment may be an operation of monitoring a duty of the data strobe signal DQS_S on which the first duty correction has been performed in the second loop 150, and the second duty correction may be an operation of performing duty correction on the data strobe signal DQS in the second loop 150. For example, the second loop 150 according to an embodiment may be disposed to be connected with the multiplexer 180 included in the buffer chip 100 and may perform duty correction on the data strobe signal DQS_S on which the first duty correction has been performed.

When the second duty correction is completed, the second loop 150 according to an embodiment may be configured so that the third switch 160 is connected with the fourth switch 170. Also, the second loop 150 according to an embodiment may perform the second duty correction on the data strobe signal DQS and may store second duty correction information obtained as a result of the performance. A configuration of the second loop 150 is described below in detail with reference to FIG. 5.

The third switch 160 according to an embodiment may be operable to connect the second loop 150 with the memory device 200 and may control a flow of the data strobe signal DQS. For example, when the second duty correction is completed in the second loop 150, the second loop 150 may generate a second flag signal Flag2 and the third switch 160 may be changed to a closed state responsive to the second flag signal Flag2. The second flag signal Flag2 according to an embodiment may be a signal representing that the second duty correction is completed. When the third switch 160 according to an embodiment is changed to a closed state, the corrected data strobe signal DQS_N may be transferred to the memory device 200. The corrected data strobe signal DQS_N according to an embodiment may be (or may be generated from) a data strobe signal DQS_M on which the second duty correction has been performed in the second loop 150.

The fourth switch 170 according to an embodiment may be operable to connect an output terminal TX of the buffer chip 100 with the multiplexer 180 on the data signal DQ and may control a flow of the data signal DQ. For example, when the second duty correction is completed in the second loop 150, the fourth switch 170 may be changed to a closed state (e.g., responsive to the second flag signal Flag2) and may transfer the data signal DQ to the multiplexer 180 through the output terminal TX.

The multiplexer 180 according to an embodiment may serialize the divided first data signal DQ_E2 and the divided second data signal DQ_O2 into a third data signal DQ_M and may transfer a serialized third data signal DQ_M to the output terminal TX. For example, the multiplexer 180 may transfer the serialized third data signal DQ_M to the memory device 200 through the fourth switch 170. When the second duty correction on the data strobe signal DQS is completed in the second loop 150, the fourth switch 170 according to an embodiment may be closed and the multiplexer 180 may transfer the serialized third data signal DQ_M to the memory device 200 through the output terminal TX.

The multiplexer 180 according to an embodiment may denote a serializer which is included in the buffer chip 100. The multiplexer 180 according to an embodiment may merge the divided first data signal DQ_E2 with the divided second data signal DQ_O2. For example, when each of the divided first data signal DQ_E2 and the divided second data signal DQ_O2 has a frequency of about 2.4 GHZ, the third data signal DQ_M may be serialized to have a frequency of about 4.8 GHz. The corrected data signal DQ_N according to an embodiment may be the third data signal DQ_M.

Figure 3:
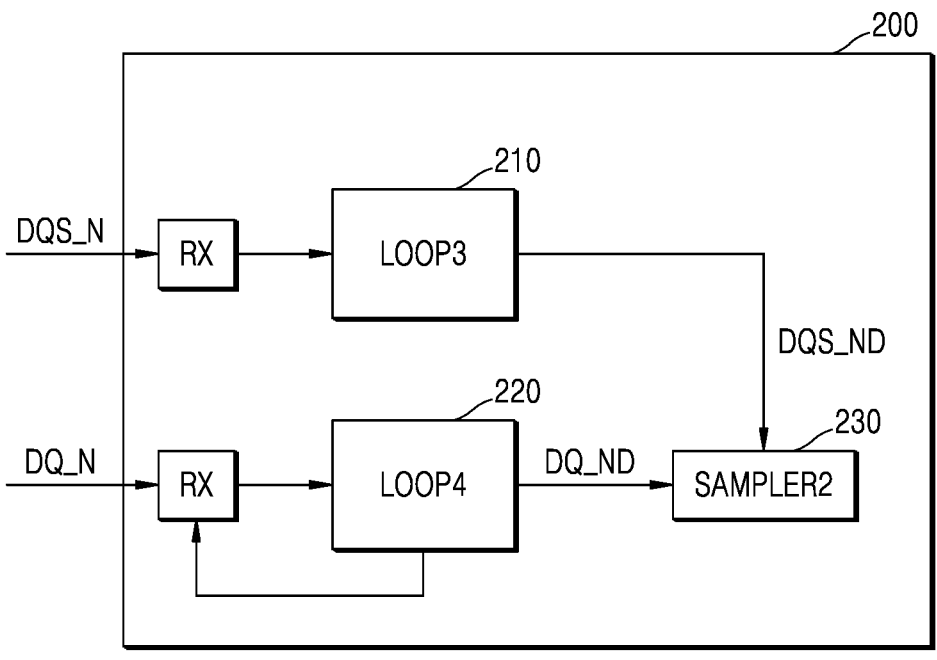
FIG. 3 is a block diagram of a memory device according to an embodiment.

FIG. 3 is a block diagram of a memory device 200 according to an embodiment.

Referring to FIG. 3, the memory device 200 according to an embodiment may include a third loop 210, a fourth loop 220, or a second sampler 230.

When the second duty correction is completed, the third loop 210 according to an embodiment may perform third monitoring on a data strobe signal DQS and may perform third duty correction on the data strobe signal DQS, based on a third monitoring result. The third monitoring according to an embodiment may be an operation which monitors a duty of the data strobe signal DQS in the third loop 210, and the third duty correction may be an operation of performing duty correction on the data strobe signal DQS in the third loop 210. For example, the third loop 210 according to an embodiment may be disposed to be connected with the second loop 150 included in the buffer chip 100 and may perform duty correction on a data strobe signal DQS_N on which correction has been performed.

When the third duty correction is completed, the memory device 200 according to an embodiment may generate a final data strobe signal DQS_ND based on corrected data strobe signal DQS_N and may store the generated final data strobe signal DQS_ND in the second sampler 230. For example, the memory device 200 may include a plurality of memories, and each of the plurality of memories included in the memory device 200 may have a different or optimal data strobe signal DQS duty value characteristic. The memory device 200 according to an embodiment may store correction information about the data strobe signal DQS or the respective or optimal data strobe signal DQS duty value in each memory cell, and when a corresponding memory is selected, the memory device 200 may allow the memory controller 11 to generate the data strobe signal DQS having a respective or optimal duty value. For example, the memory device 200 may store third duty correction information in at least one of a plurality of non-volatile memories, and when at least one memory is selected from among the plurality of non-volatile memories, the memory device 200 may allow the memory controller 11 to generate the data strobe signal DQS by using the third duty correction information. The third duty correction information according to an embodiment may include information about the final data strobe signal DQS_ND.

The fourth loop 220 according to an embodiment may perform fourth duty correction on the data signal DQ based on a result of the first, second, and/or third duty correction. The fourth loop 220 according to an embodiment may be a loop which is included in the memory device 200 and corrects a duty of the data signal DQ, and the fourth duty correction may denote correction of the data signal DQ, performed by the memory device 200, based on the corrected data strobe signal DQS_N. The third duty correction may be simultaneously performed with the fourth duty correction according to an embodiment. As used herein, operations described as being performed "simultaneously" or at the same time may not require identical timing for execution or completion, but rather, may more generally refer to operations performed in parallel or otherwise with at least some overlap in time.

When the fourth duty correction is completed, the memory device 200 according to an embodiment may generate a final data signal DQ_ND based on corrected data signal DQ_N and may store the generated final data signal DQ_ND in the second sampler 230. For example, each of the plurality of memories included in the memory device 200 may have a different or optimal data signal DQ duty value characteristic. The memory device 200 according to an embodiment may store correction information about the data signal DQ or the respective or optimal data signal DQ duty value in each memory cell, and when a corresponding memory is selected, the memory device 200 may allow the memory controller 11 to generate the data signal DQ having a respective or optimal duty value. For example, the memory device 200 may store fourth duty correction information in at least one of the plurality of non-volatile memories, and when at least one memory is selected from among the plurality of non-volatile memories, the memory device 200 may allow the memory controller 11 to generate the data signal DQ by using the fourth duty correction information. The fourth duty correction information according to an embodiment may include information about the final data signal DQ_ND.

Figure 4:
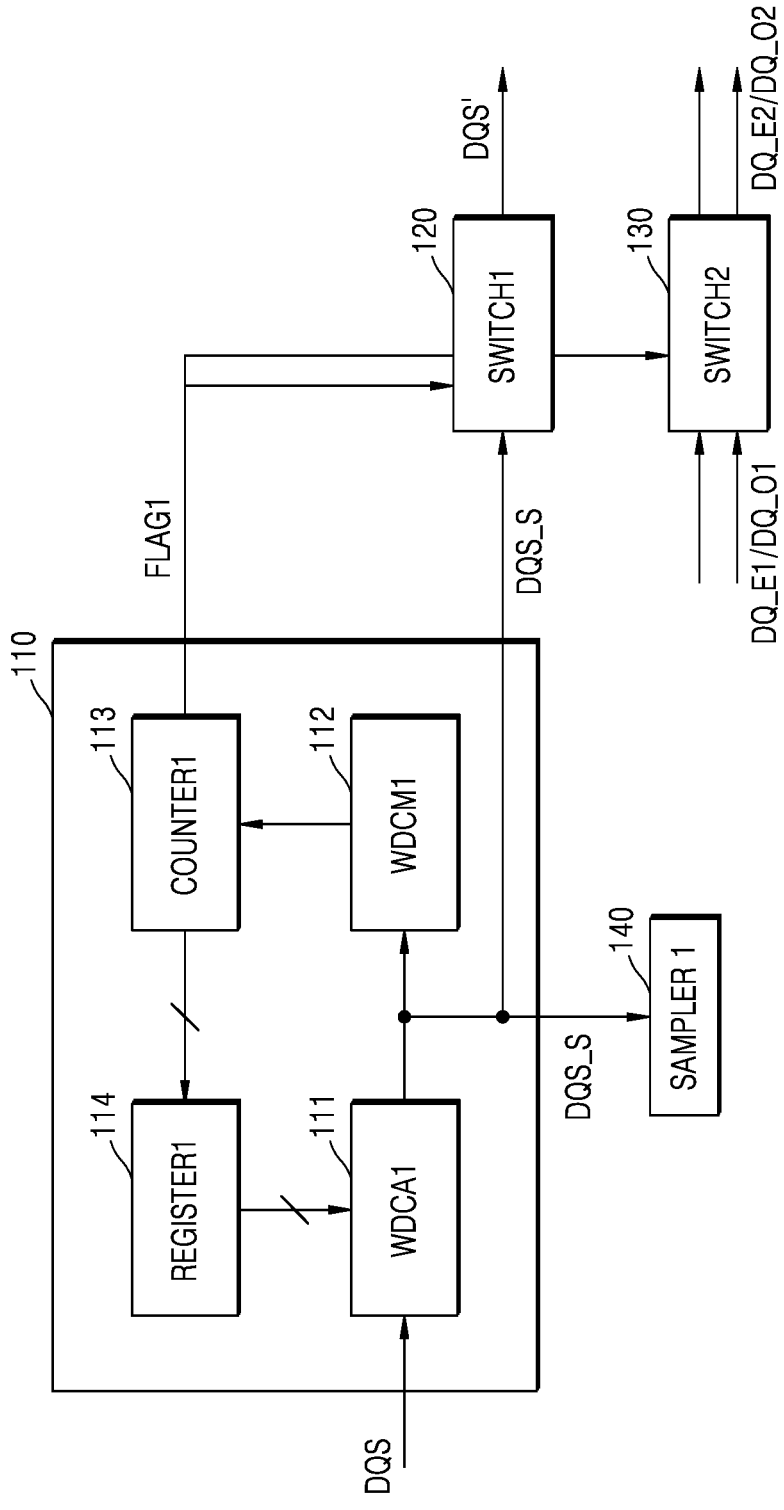
FIG. 4 is a block diagram for describing a configuration of a first loop.

FIG. 4 is a block diagram for describing a configuration of the first loop 110.

Referring to FIG. 4, the first loop 110 according to an embodiment may include a first data strobe signal monitor 111, a first data strobe signal compensator 112, a first counter 113, and a first register 114.

The first data strobe signal monitor 111 according to an embodiment may monitor a duty value of a received data strobe signal DQS. When a duty value of the data strobe signal DQS is monitored, the first data strobe signal compensator 112 according to an embodiment may compensate for the duty value of the data strobe signal DQS and may generate a data strobe signal DQS_S on which first duty correction has been performed. The first loop 110 according to an embodiment may allow the first data strobe signal monitor 111 to again monitor the data strobe signal DQS_S on which the first duty correction has been performed.

For example, the first data strobe signal compensator 112 according to an embodiment may combine a compensation signal with the data strobe signal DQS, or may remove an undesired signal included in the data strobe signal DQS, thereby compensating for the data strobe signal DQS. The data strobe signal DQS according to an embodiment may be compensated for so that the data signal DQ matches a rising edge, also referred to herein as synchronization. The first data strobe signal monitor 111 according to an embodiment may be an element which is included in the first loop 110 and monitors the data strobe signal DQS, and the first data strobe signal compensator 112 may be an element which is included in the first loop 110 and performs compensation on the data strobe signal DQS and the data strobe signal DQS_S on which the first duty correction has been performed.

The first counter 113 according to an embodiment may detect an edge of the data strobe signal DQS_S on which the first duty correction has been performed and may measure matching between a rising edge of the data signal DQ and a rising edge of the data strobe signal DQS_S on which the first duty correction has been performed. The first counter 113 according to an embodiment may be an element which is included in the first loop 110 and performs a counting operation on the data strobe signal DQS. When mismatch between the rising edge of the data signal DQ and the rising edge of the data strobe signal DQS_S, on which the first duty correction has been performed, is measured by the first counter 113 according to an embodiment, the first loop 110 according to an embodiment may repeat a duty correction operation on the data strobe signal DQS.

When matching or synchronization between the rising edge of the data signal DQ and the rising edge of the data strobe signal DQS_S, on which the first duty correction has been performed, is measured by the first counter 113 according to an embodiment, the first loop 110 may store first information about the first duty correction in the first register 114. The first information according to an embodiment may include the magnitude of a duty value which is corrected when the first duty correction is performed. The first register 114 according to an embodiment may be an element which is included in the first loop 110 and stores the first information associated with the first duty correction.

When the first duty correction according to an embodiment is completed, a first flag signal Flag1 may be generated and the first switch 120 and the second switch 130 may be changed to a closed state. That is, when the first duty correction is completed, the first switch 120 may be connected with the second switch 130 by the first flag signal Flag1.

Figure 5:
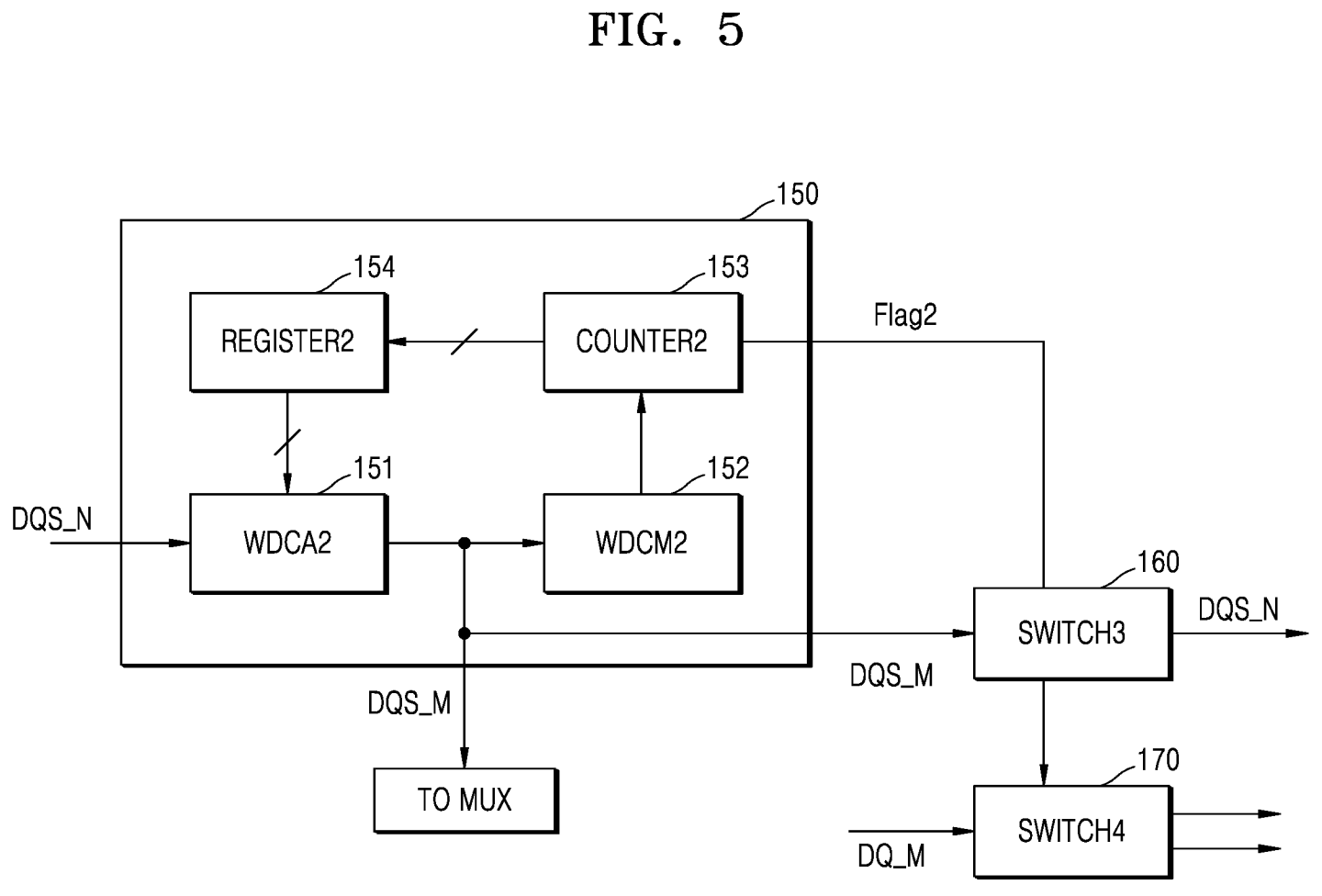

FIG. 5 is a block diagram for describing a configuration of a second loop 150 according to an embodiment.

Referring to FIG. 5, the second loop 150 according to an embodiment may include a second data strobe signal monitor 151, a second data strobe signal compensator 152, a second counter 153, and a second register 154.

The second data strobe signal monitor 151 according to an embodiment may monitor a duty value of a data strobe signal DQS_S on which first duty correction has been performed and may thus finally monitor the duty value of the data strobe signal DQS_S. Also, the second data strobe signal monitor 151 according to an embodiment may monitor or generate a data strobe signal DQS_M, on which second duty correction has been performed, by using the data strobe signal DQS_S or DQS' as an input.

When the duty value of the data strobe signal DQS_S on which first duty correction has been performed is monitored, the second data strobe signal compensator 152 according to an embodiment may compensate for the duty value of the data strobe signal DQS_S. The second data strobe signal compensator 152 according to an embodiment may combine a compensation signal with the data strobe signal DQS_S on which the first duty correction has been performed, or may remove an undesired signal included in the data strobe signal DQS_S on which the first duty correction has been performed, thereby compensating for the data strobe signal DQS. Also, the second data strobe signal compensator 152 according to an embodiment may combine the compensation signal with the data strobe signal DQS_M on which second duty correction has been performed, or may remove an undesired signal included in the data strobe signal DQS_M on which the second duty correction has been performed, thereby compensating for the data strobe signal DQS.

The data strobe signal DQS according to an embodiment may be compensated for so that the data signal DQ matches a rising edge. The second data strobe signal monitor 151 according to an embodiment may be an element which is included in the second loop 150 and monitors the data strobe signal DQS, the data strobe signal DQS_S on which the first duty correction has been performed, and the data strobe signal DQS_M on which the second duty correction has been performed, and the second data strobe signal compensator 152 may be an element which is included in the second loop 150 and performs compensation on the data strobe signal DQS, the data strobe signal DQS_S on which the first duty correction has been performed, and the data strobe signal DQS_M on which the second duty correction has been performed.

The second counter 153 according to an embodiment may detect an edge of the data strobe signal DQS_M on which the second duty correction has been performed and may measure matching between a rising edge of the data signal DQ and a rising edge of the data strobe signal DQS_M on which the second duty correction has been performed. The second counter 153 according to an embodiment may be an element which is included in the second loop 150 and performs a counting operation on the data strobe signal DQS or the data strobe signal DQS_S on which the first duty correction has been performed. When mismatch between the rising edge of the data strobe signal DQS and the rising edge of the data strobe signal DQS_M, on which the second duty correction has been performed, is measured by the second counter 153 according to an embodiment, the second loop 150 according to an embodiment may repeat a duty correction operation on the data strobe signal DQS.

When matching between the rising edge of the data signal DQ and the rising edge of the data strobe signal DQS_M, on which the second duty correction has been performed, is measured by the second counter 153 according to an embodiment, the second loop 150 may store second information about the second duty correction in the second register 154. The second information according to an embodiment may include the magnitude of a duty value which is corrected when the second duty correction is performed. The second register 154 according to an embodiment may be an element which is included in the second loop 150 and stores the second information associated with the second duty correction.

When the second duty correction according to an embodiment is completed, a second flag signal Flag2 may be generated and the third switch 160 and the fourth switch 170 may be changed to a closed state. That is, when the second duty correction is completed, the third switch 160 may be connected with the fourth switch 170 by the second flag signal Flag1.

Figure 6:
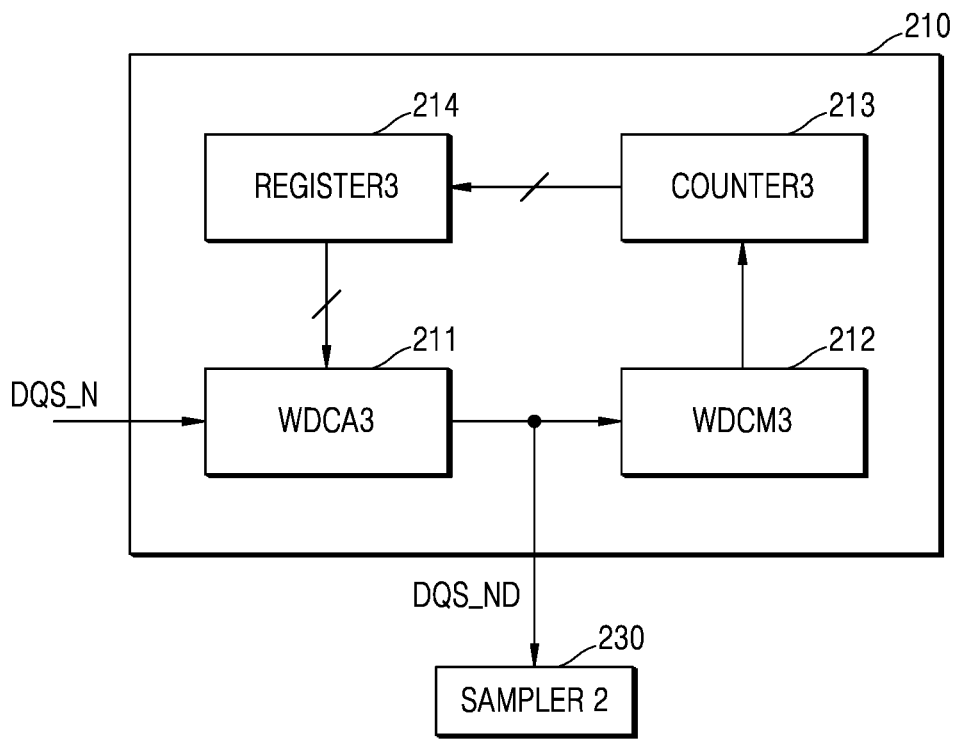
FIG. 6 is a block diagram for describing a configuration of a third loop according to an embodiment.

FIG. 6 is a block diagram for describing a configuration of a third loop 210 according to an embodiment.

Referring to FIG. 6, the third loop 210 according to an embodiment may include a third data strobe signal monitor 211, a third data strobe signal compensator 212, a third counter 213, and a third register 214.

The third data strobe signal monitor 211 according to an embodiment may receive a corrected data strobe signal DQS_N and may monitor a duty value of the corrected data strobe signal DQS_N. When the duty value of the corrected data strobe signal DQS_N is monitored, the third data strobe signal compensator 212 according to an embodiment may compensate for a duty value of a data strobe signal DQS. For example, the third data strobe signal compensator 212 according to an embodiment may combine a compensation signal with the corrected data strobe signal DQS_N, or may remove an undesired signal included in the corrected data strobe signal DQS_N, thereby compensating for the data strobe signal DQS finally. The data strobe signal DQS according to an embodiment may be compensated for so that the data signal DQ matches a rising edge. The third data strobe signal monitor 211 according to an embodiment may be an element which is included in the third loop 210 and monitors the corrected data strobe signal DQS_N, and the third data strobe signal compensator 212 may be an element which is included in the third loop 210 and performs compensation on the data strobe signal DQS and the corrected data strobe signal DQS_N.

The third counter 213 according to an embodiment may detect an edge of a data strobe signal on which third duty correction has been performed and may measure matching between a rising edge of a data signal DQ and a rising edge of the data strobe signal on which the third duty correction has been performed. The third counter 213 according to an embodiment may be an element which is included in the third loop 210 and performs a counting operation on the corrected data strobe signal DQS_N. When mismatch between the rising edge of the data signal DQ and the rising edge of the data strobe signal, on which the third duty correction has been performed, is measured by the third counter 213 according to an embodiment, the third loop 210 according to an embodiment may repeat a duty correction operation on the corrected data strobe signal DQS_N.

When matching between the rising edge of the data signal DQ and the rising edge of the data strobe signal, on which the third duty correction has been performed, is measured by the third counter 213 according to an embodiment, the third loop 210 may store third information about the third duty correction in the third register 214. The third information according to an embodiment may include the magnitude of a duty value which is corrected when the third duty correction is performed. The third register 214 according to an embodiment may be an element which is included in the third loop 210 and stores the third information associated with the third duty correction.

When the third duty correction according to an embodiment is completed, the third loop 210 may transfer a final data strobe signal DQS_ND to the second sampler 230, and the second sampler 230 may store information about the final data strobe signal DQS_ND received thereby.

Figure 7:
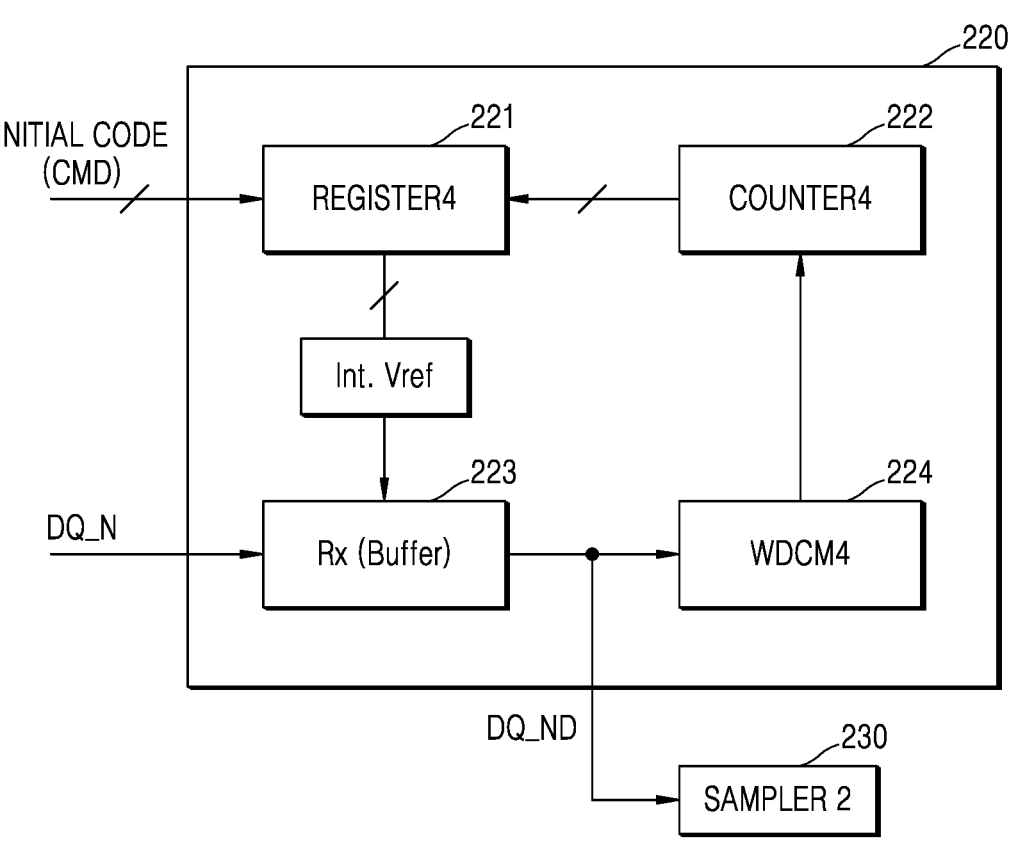
FIG. 7 is a block diagram for describing a configuration of a fourth loop according to an embodiment.

FIG. 7 is a block diagram for describing a configuration of a fourth loop 220 according to an embodiment.

Referring to FIG. 7, the fourth loop 220 according to an embodiment may include a fourth register 221, a fourth counter 222, a data signal monitor 223, a fourth counter 222, a fourth register 223, and a data signal compensator 224.

The fourth register 221 according to an embodiment may receive a predetermined voltage code (Initial Code (CMD)) from the memory controller 11 and may store the voltage code. When matching between a rising edge of a data strobe signal DQS and a rising edge of a data signal, on which fourth duty correction has been performed, is measured by the fourth counter 222 according to an embodiment, the fourth loop 220 may store fourth information about the fourth duty correction in the fourth register 221. The fourth information according to an embodiment may include the magnitude of a duty value which is corrected when the fourth duty correction is performed. The fourth register 221 according to an embodiment may be an element which is included in the fourth loop 220 and stores the fourth information associated with the fourth duty correction.

The data signal monitor 223 according to an embodiment may receive a corrected data signal DQ_N and may monitor a duty value of the corrected data signal DQ_N. When the duty value of the corrected data signal DQ_N is monitored, the fourth counter 222 according to an embodiment may detect an edge of the data signal on which the fourth duty correction has been performed and may measure matching between the rising edge of the data strobe signal DQS and the rising edge of the data signal on which the fourth duty correction has been performed. The fourth counter 222 according to an embodiment may be an element which is included in the fourth loop 220 and performs a counting operation on the corrected data signal DQ_N. When mismatch between the rising edge of the data strobe signal DQS and the rising edge of the data signal, on which the fourth duty correction has been performed, is measured by the fourth counter 222 according to an embodiment, the fourth loop 220 according to an embodiment may repeat a duty correction operation on the corrected data signal DQ_N. The corrected data signal DQ_N according to an embodiment may denote a data signal DQ which is obtained through serialization after de-serialization.

The data signal compensator 224 according to an embodiment may compensate for a duty value of the data signal DQ. For example, the data signal compensator 224 may compensate for the duty value of the data signal DQ, based on a predetermined reference voltage. The may compensate for the duty value of the data signal DQ, based on a predetermined reference voltage according to an embodiment may be generated based on an instruction received from the memory controller 11. For example, the memory controller 11 may transfer a predetermined voltage code to a buffer chip 100, and the buffer chip 100 may generate the reference voltage, based on the predetermined voltage code.

The data signal compensator 224 according to an embodiment may combine a compensation signal with a corrected data signal DQ_N, or may remove an undesired signal included in the corrected data signal DQ_N, thereby compensating for a data signal DQ finally. The data signal DQ according to an embodiment may be compensated for so that the data strobe signal DQS matches a rising edge. The fourth data strobe signal monitor 223 according to an embodiment may be an element which is included in the fourth loop 220 and monitors the corrected data signal DQ_N, and the fourth data strobe signal compensator 224 may be an element which is included in the fourth loop 220 and performs compensation on the data signal DQ and the corrected data signal DQ_N.

When the fourth duty correction according to an embodiment is completed, the third loop may transfer a final data signal DQ_ND to the second sampler 230, and the second sampler 230 may store information about the final data signal DQ_ND received thereby.

Figure 8:
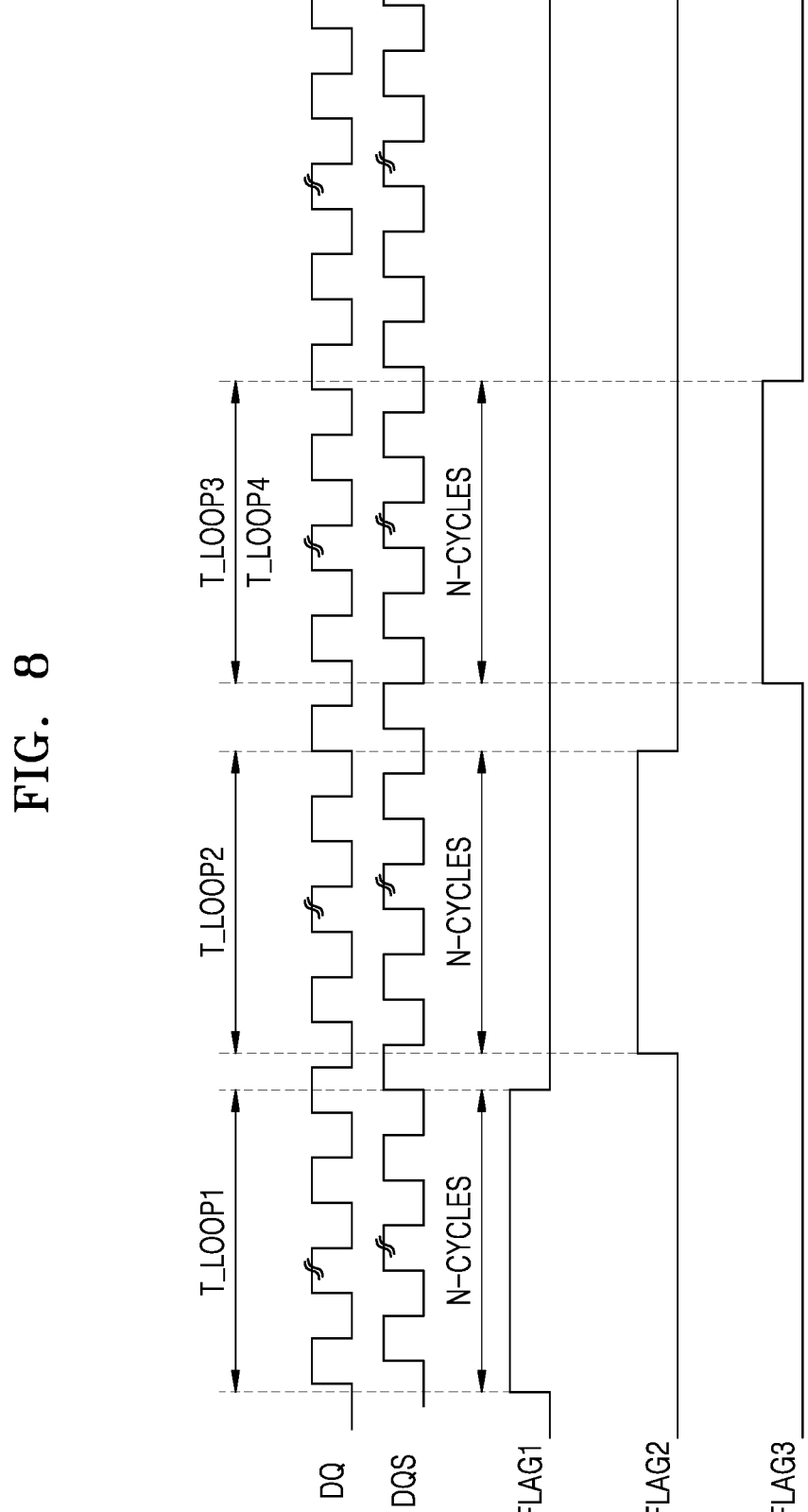
FIG. 8 is a timing diagram of a memory system according to an embodiment.

FIG. 8 is a timing diagram of a memory system 10 according to an embodiment.

Referring to FIG. 8, a first loop term T_LOOP1 or a second loop term T_LOOP2 may be repeated during a predetermined cycle (N-cycles). For example, when the predetermined cycle is set to "3", the first loop 110 or the second loop 150 may perform a duty correction operation during three clock cycles. However, the predetermined cycle according to an embodiment is not limited thereto and may be set so that duty correction is performed during a different cycle or different number of cycles. Also, the first loop term T_LOOP1 and the second loop term T_LOOP2 may be set to have different cycles. In the first loop term T_LOOP1 according to an embodiment, a first flag signal Flag1 may be activated.

The first loop term T_LOOP1 or the second loop term T_LOOP2 according to an embodiment may be performed sequentially. The first loop term T_LOOP1 or the second loop term T_LOOP2 according to an embodiment may be set to be performed until a predetermined bit is added. For example, when the predetermined bit is set to "2", the first loop 110 or the second loop 150 may perform a duty correction operation until a 2-bit clock is added. However, the predetermined bit according to an embodiment is not limited thereto and may be set so that duty correction is performed until a bit having a different value (e.g., greater than "2") is added. In the second loop term T_LOOP2 according to an embodiment, a second flag signal Flag2 may be activated.

A third loop term T_LOOP3 may be set to be executed in parallel with a fourth loop term T_LOOP4 according to an embodiment. For example, the memory device 200 according to an embodiment may perform control to simultaneously perform a duty correction operation of a data strobe signal DQS in the third loop term T_LOOP3 and a duty correction operation of a data signal DQ in the fourth loop term T_LOOP4. In the third loop term T_LOOP3 according to an embodiment, a third flag signal Flag3 may be activated.

When a duty correction operation on the data strobe signal DQS and the data signal DQ is completed in the first loop term T_LOOP1, rising edges of the second loop term T_LOOP2, the third loop term T_LOOP3, and the fourth loop term T_LOOP4, the data strobe signal DQS and the data signal DQ according to an embodiment may match. For example, duty correction may be performed so that rising edges of the data strobe signal DQS and the data signal DQ match or are synchronized after a completion time t1 at which a duty correction operation is completed.

Figure 9:
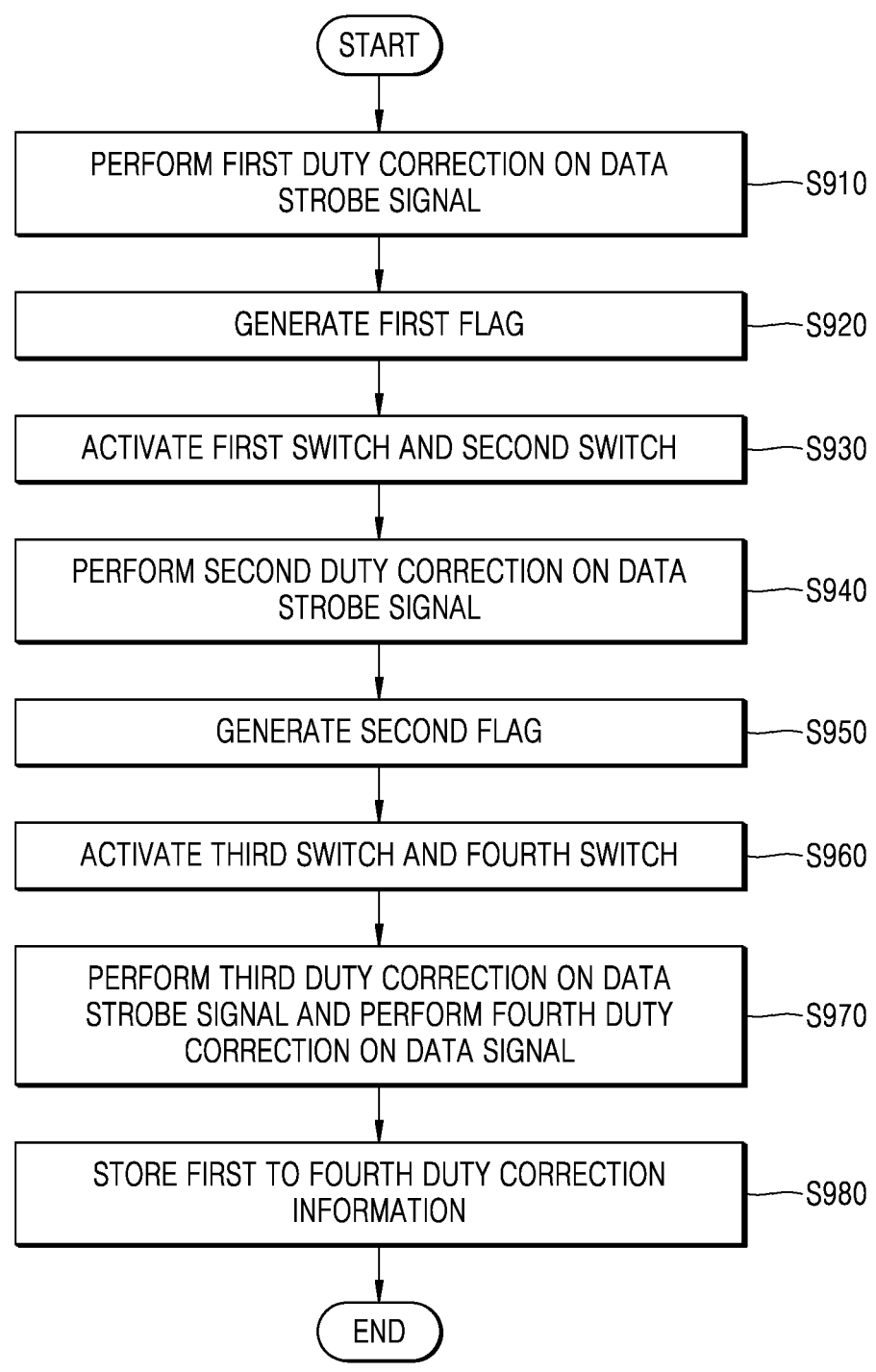
FIGS. 9 and 10 are flowcharts of an operating method of a memory system, according to an embodiment.
Figure 10:
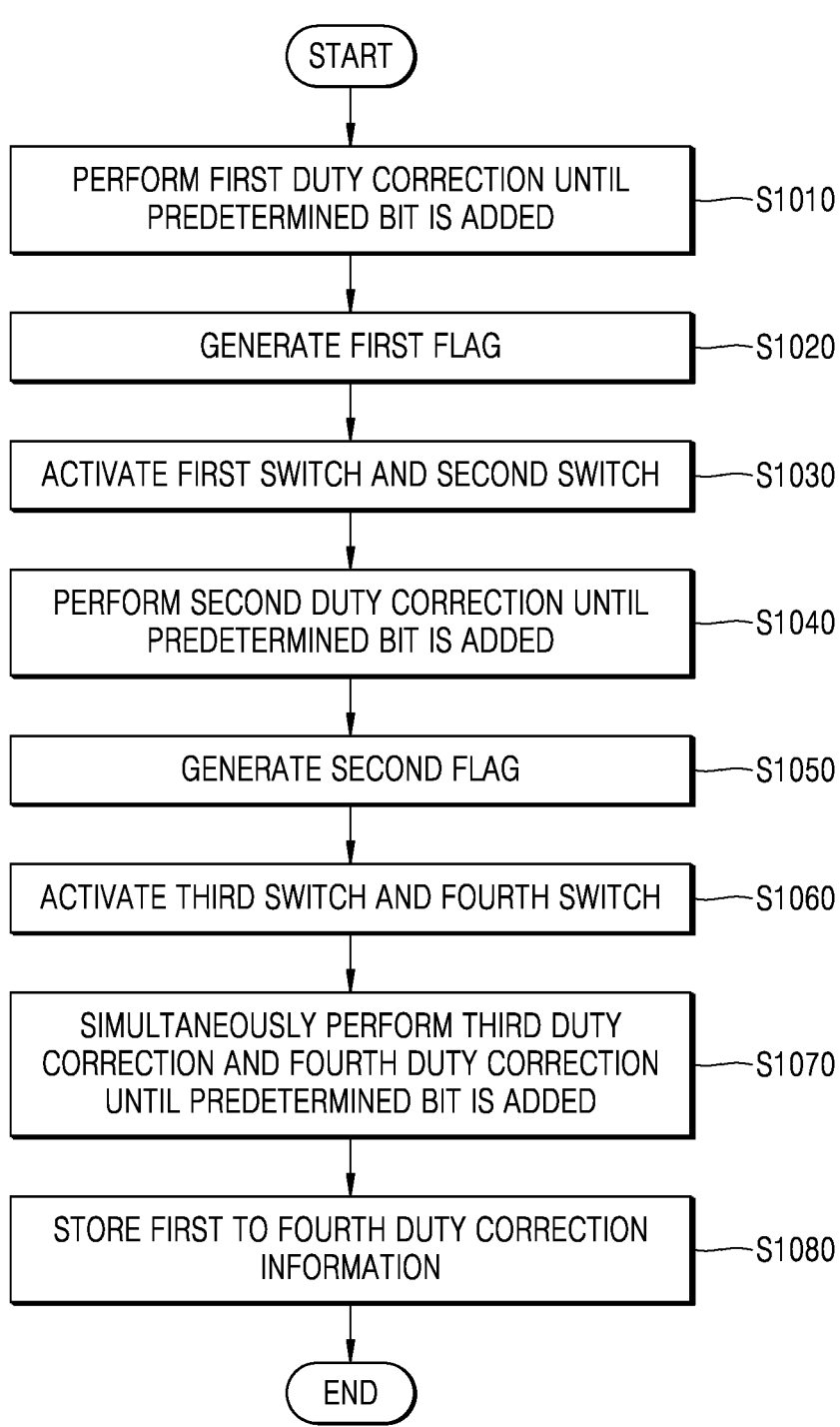

FIGS. 9 and 10 are flowcharts of an operating method of the memory system 10, according to an embodiment.

Referring to FIG. 9, the memory system 10 according to an embodiment may perform first duty correction on a data strobe signal in operation S910.

The memory system 10 according to an embodiment may perform first monitoring on the data strobe signal DQS and may perform first duty correction on the data strobe signal DQS, based on a first monitoring result. The first monitoring according to an embodiment may be an operation which monitors a duty of the data strobe signal DQS in the first loop 110, and the first duty correction may be an operation of performing duty correction on the data strobe signal DQS in the first loop 110.

When the first duty correction is completed, the memory system 10 according to an embodiment may generate a first flag in operation S920. For example, when the first duty correction is completed in the first loop 110, the first loop 110 may generate a first flag signal Flag1 and the first switch 120 may be changed to a closed state. The first flag signal Flag1 according to an embodiment may be a signal representing that the first duty correction is completed.

When the first flag is generated, the first switch and the second switch of the memory system 10 according to an embodiment may be activated in operation S930. When the first duty correction according to an embodiment is completed, the first flag signal Flag1 may be generated and the first switch 120 and the second switch 130 may be changed to a closed state in response. That is, when the first duty correction is completed, the first switch 120 may be connected with the second switch 130 by the first flag signal Flag1.

When the first switch and the second switch are activated, the memory system 10 according to an embodiment may perform second duty correction on a data strobe signal in operation S940.

When the first duty correction is completed, the memory system 10 according to an embodiment may perform second monitoring on the data strobe signal DQS and may perform second duty correction on the data strobe signal DQS, based on a second monitoring result. The second monitoring according to an embodiment may be an operation of monitoring a duty of the data strobe signal DQS in the second loop 150, and the second duty correction may be an operation of performing duty correction on the data strobe signal DQS in the second loop 150. For example, the second loop 150 according to an embodiment may be disposed to be connected with the multiplexer 180 included in the buffer chip 100 and may perform duty correction on a data strobe signal DQS' (or DQS_S) on which the first duty correction has been performed.

When the second duty correction is completed, the memory system 10 according to an embodiment may generate a second flag in operation S950. When the second duty correction is completed, the memory system 10 according to an embodiment may generate a second flag signal Flag2, and the third switch 160 may be changed to a closed state in response. The second flag signal Flag2 according to an embodiment may be a signal representing that the second duty correction is completed.

When the second flag signal Flag2 is generated, the third switch and the fourth switch of the memory system 10 according to an embodiment may be activated in operation S960.

When the third switch 160 according to an embodiment is changed to a closed state, a corrected data strobe signal DQS_N may be transferred to the memory device 200. The corrected data strobe signal DQS_N according to an embodiment may be a data strobe signal DQS on which up to the second duty correction has been performed. The fourth switch 170 according to an embodiment may connect an output terminal TX of the buffer chip 100 with the multiplexer 180 on the data signal DQ and may control a flow of the data signal DQ. For example, when the fourth switch 170 is changed to a closed state, the data signal DQ may be transferred to the memory device 200 through the output terminal TX.

When the third switch and the fourth switch are activated, the memory system 10 according to an embodiment may perform third duty correction on the data strobe signal and fourth duty correction on the data signal in operation S970.

When the second duty correction is completed, the memory system 10 according to an embodiment may perform third monitoring on the data strobe signal DQS and may perform the third duty correction on the data strobe signal DQS, based on a third monitoring result. The third monitoring according to an embodiment may be an operation which monitors a duty of the data strobe signal DQS in the third loop 210, and the third duty correction may be an operation of performing duty correction on the data strobe signal DQS in the third loop 210.

The memory system 10 according to an embodiment may perform fourth duty correction on the data signal DQ based on a result of the third duty correction. The fourth loop 220 according to an embodiment may be a loop which is included in the memory device 200 and corrects a duty of the data signal DQ, and the fourth duty correction may denote correction of the data signal DQ, performed by the memory device 200, based on the corrected data strobe signal DQS_N. The third duty correction may be simultaneously performed with the fourth duty correction according to an embodiment.

When the third duty correction on the data strobe signal and the fourth duty correction on the data signal are performed, the memory system 10 according to an embodiment may store first, second, third, and/or fourth duty correction information in operation S980.

When it is measured that a rising edge of the data signal DQ matches the data strobe signal DQS' on which the first duty correction has been performed, the memory system 10 according to an embodiment may store first information about the first duty correction in the first register 114. When it is measured that the rising edge of the data signal DQ matches the data strobe signal on which the second duty correction has been performed, the memory system 10 according to an embodiment may store second information about the second duty correction in the second register 154.

When it is measured that the rising edge of the data signal DQ matches the data strobe signal on which the third duty correction has been performed, the memory system 10 according to an embodiment may store third information about the third duty correction in the third register 214. When it is measured that the rising edge of the data strobe signal DQS matches the data signal on which the fourth duty correction has been performed, the memory system 10 according to an embodiment may store fourth information about the fourth duty correction in the fourth register 221.

Referring to FIG. 10, the memory system 10 according to an embodiment may perform first duty correction until a predetermined bit is added in operation S1010. For example, when the predetermined bit is set to "2", the first loop 110 may perform a duty correction operation until a 2-bit clock is added. However, the predetermined bit according to an embodiment is not limited thereto and may be set so that duty correction is performed until a bit having a different value is added.

When the first duty correction is completed, the memory system 10 according to an embodiment may generate a first flag in operation S1020. For example, when the first duty correction is completed in the first loop 110, the first loop 110 may generate a first flag signal Flag1 and the first switch 120 may be changed to a closed state responsive to the first flag signal Flag1. The first flag signal Flag1 according to an embodiment may be a signal representing that the first duty correction is completed.

When the first flag is generated, the first switch and the second switch of the memory system 10 according to an embodiment may be activated in operation S1030. When the first duty correction according to an embodiment is completed, a first flag signal Flag1 may be generated and the first switch 120 and the second switch 130 may each be changed to a closed state responsive to the first flag signal Flag1.

When the first switch and the second switch are activated, the memory system 10 according to an embodiment may perform second duty correction until a predetermined bit is added in operation S1040. For example, when the predetermined bit is set to "2", the second loop 150 may perform a duty correction operation until a 2-bit clock is added. However, the predetermined bit according to an embodiment is not limited thereto and may be set so that duty correction is performed until a bit having a different value is added.

When the second duty correction is completed, the memory system 10 according to an embodiment may generate a second flag in operation S1050. When the second duty correction is completed, the memory system 10 according to an embodiment may generate a second flag signal Flag2, and the third switch 160 may be changed to a closed state responsive to the second flag signal Flag2. The second flag signal Flag2 according to an embodiment may be a signal representing that the second duty correction is completed.

When the second flag signal Flag2 is generated, the third switch 160 and the fourth switch 170 of the memory system 10 according to an embodiment may be activated in operation S1060. That is, the third switch and the fourth switch may each be changed to a closed state responsive to the second flag signal Flag2.

When the third switch 160 according to an embodiment is changed to a closed state, the corrected data strobe signal DQS_N may be transferred to the memory device 200. The corrected data strobe signal DQS_N according to an embodiment may be a data strobe signal DQS on which up to the second duty correction has been performed. The fourth switch 170 according to an embodiment may be operable to connect an output terminal TX of the buffer chip 100 with the multiplexer 180 on the data signal DQ and may control a flow of the data signal DQ. For example, when the fourth switch 170 is changed to a closed state, the data signal DQ may be transferred to the memory device 200 through the output terminal TX.

When the third switch and the fourth switch are activated, the memory system 10 according to an embodiment may simultaneously perform third duty correction and fourth duty correction until a predetermined bit is added in operation S1070. For example, when the predetermined bit is set to "2", the second loop 150 may perform a duty correction operation during addition of a 2-bit clock. However, the predetermined bit according to an embodiment is not limited thereto and may be set so that duty correction is performed until a bit having a different value is added.

When the third duty correction on the data strobe signal and the fourth duty correction on the data signal are performed, the memory system 10 according to an embodiment may store first to fourth duty correction information in operation S1080.

When it is measured that a rising edge of the data signal DQ matches the data strobe signal DQS' on which the first duty correction has been performed, the memory system 10 according to an embodiment may store first information about the first duty correction in the first register 114. When it is measured that the rising edge of the data signal DQ matches the data strobe signal on which the second duty correction has been performed, the memory system 10 according to an embodiment may store second information about the second duty correction in the second register 154.

When it is measured that the rising edge of the data signal DQ matches the data strobe signal on which the third duty correction has been performed, the memory system 10 according to an embodiment may store third information about the third duty correction in the third register 214. When it is measured that the rising edge of the data strobe signal DQS matches the data signal on which the fourth duty correction has been performed, the memory system 10 according to an embodiment may store fourth information about the fourth duty correction in the fourth register 221.

Figure 11A:
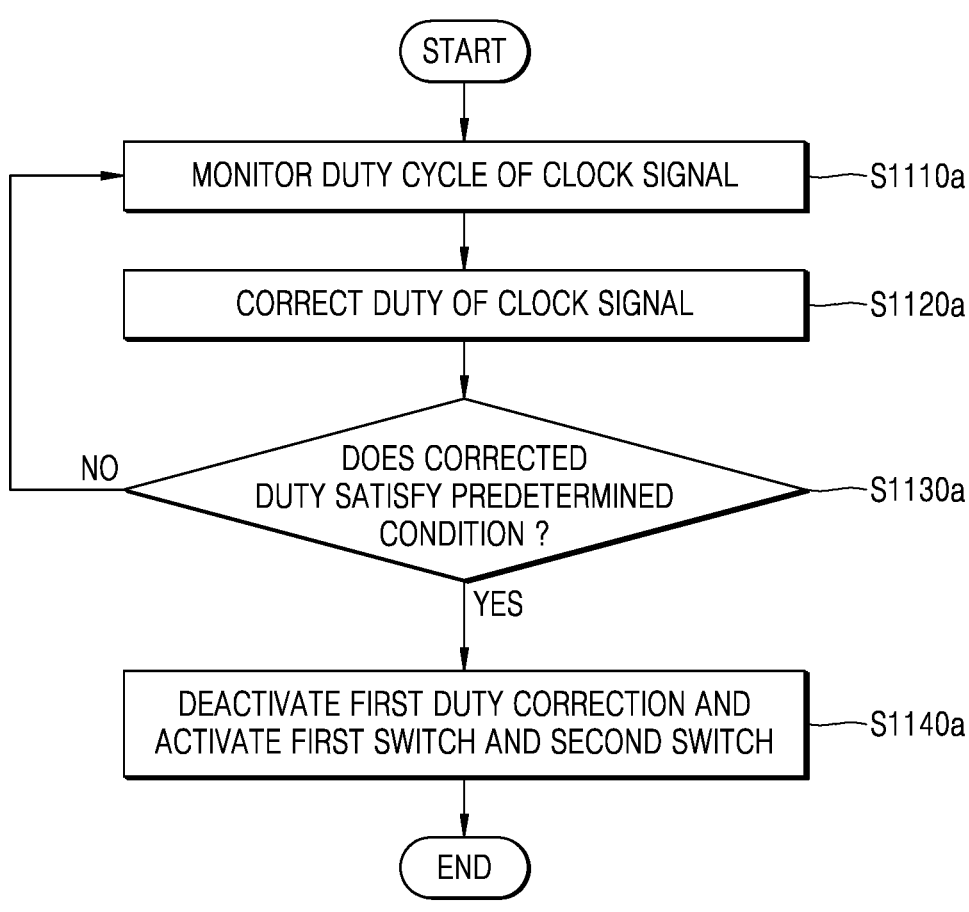
FIGS. 11A and 11B are flowcharts for describing an operation of each of a first loop and a second loop in an operating method of a memory system, according to an embodiment.
Figure 11B:
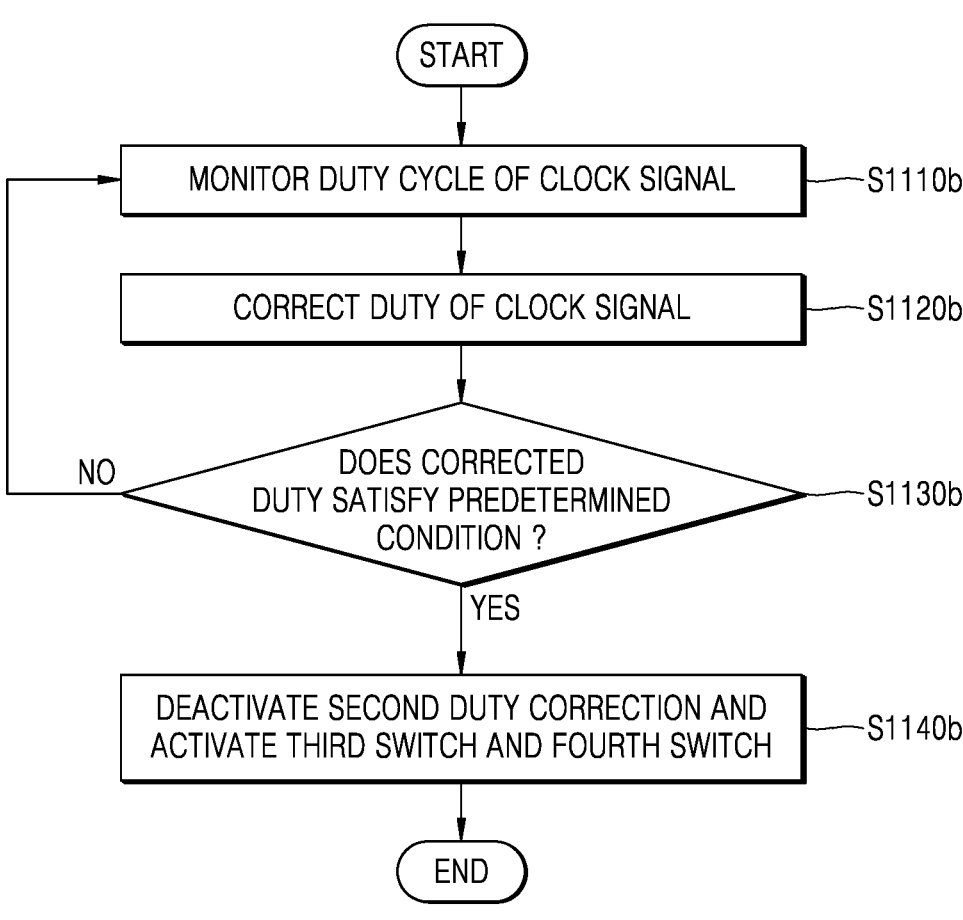

FIGS. 11A and 11B are flowcharts for describing an operation of each of a first loop and a second loop in an operating method of the memory system 10, according to an embodiment.

Referring to FIG. 11A, the memory system 10 according to an embodiment may monitor a duty cycle of a clock signal in operation S1110a.

The memory system 10 according to an embodiment may perform first monitoring on the data strobe signal DQS and may perform first duty correction on the data strobe signal DQS, based on a first monitoring result. The first monitoring according to an embodiment may be an operation of monitoring a duty of the data strobe signal DQS in the first loop 110.

The memory system 10 according to an embodiment may correct the duty of the clock signal in operation S1120a.

The memory system 10 according to an embodiment may combine a compensation signal with the data strobe signal DQS, or may remove an undesired signal included in the data strobe signal DQS, thereby compensating for the data strobe signal DQS. The data strobe signal DQS according to an embodiment may be compensated for so that the data signal DQ matches a rising edge, that is, such that the rising edge of DQ and DQS are synchronized.

The memory system 10 according to an embodiment may determine whether a corrected duty satisfies a predetermined condition in operation S1130a.

The predetermined condition according to an embodiment may include whether a duty correction operation is performed during a predetermined cycle or whether a predetermined bit is added. For example, when the predetermined cycle is set to "5", the first loop 110 may perform a duty correction operation during five clock cycles. However, the predetermined cycle according to an embodiment is not limited thereto and may be set so that duty correction is performed during a different cycle or different number of cycles. As another example, when the predetermined bit is set to "2", the first loop 110 may perform a duty correction operation until a 2-bit clock is added. However, the predetermined bit according to an embodiment is not limited thereto and may be set so that duty correction is performed until a bit having a different value is added.

When it is determined that the corrected duty satisfies the predetermined condition, the memory system 10 according to an embodiment may deactivate the first duty correction (i.e., the first duty correction may be completed) and may activate a first switch and a second switch (e.g., may operate the first switch and the second switch to each transition from an electrically open state to an electrically closed state) in operation S1140a.

The first switch according to an embodiment may be operable to connect the first loop 110 with the second loop 150 and may control a flow of the data strobe signal DQS. For example, when the first duty correction is completed in the first loop 110, the first loop 110 may generate a first flag signal Flag1 and the first switch may be changed to a closed state. The first flag signal Flag1 according to an embodiment may be a signal representing that the first duty correction is completed. When the first switch according to an embodiment is changed to a closed state, the data strobe signal DQS' on which the first duty correction has been performed may be transferred to the second loop 150.

The second switch according to an embodiment may be operable to connect the first sampler 140 with the multiplexer 180 on the data signal DQ and may control a flow of the data signal DQ. For example, when the first duty correction is completed in the first loop 110, the second switch may be changed to a closed state and may transfer the data signal DQ to the multiplexer 180.

However, when it is determined that the corrected duty does not satisfy the predetermined condition, the memory system 10 according to an embodiment may continuously monitor a duty of the data strobe signal DQS, that is, by returning to operation S1110a.

Referring to FIG. 11B, the memory system 10 according to an embodiment may monitor a duty cycle of a clock signal in operation S1110b.

The memory system 10 according to an embodiment may perform second monitoring on the data strobe signal DQS and may perform second duty correction on the data strobe signal DQS, based on a second monitoring result. The second monitoring according to an embodiment may be an operation of monitoring a duty of the data strobe signal DQS in the second loop 150.

The memory system 10 according to an embodiment may correct a duty of the clock signal in operation S1120b.

The memory system 10 according to an embodiment may combine a compensation signal with the data strobe signal DQS, or may remove an undesired signal included in the data strobe signal DQS, thereby compensating for the data strobe signal DQS. The data strobe signal DQS according to an embodiment may be compensated for so that the data signal DQ matches a rising edge, that is, such that the rising edge of DQ and DQS are synchronized.

The memory system 10 according to an embodiment may determine whether a corrected duty satisfies a predetermined condition in operation S1130b.

The predetermined condition according to an embodiment may include whether a duty correction operation is performed during a predetermined cycle or whether a predetermined bit is added. For example, when the predetermined cycle is set to "5", the second loop 150 may perform a duty correction operation during five clock cycles. However, the predetermined cycle according to an embodiment is not limited thereto and may be set so that duty correction is performed during a different cycle or a different number of cycles. As another example, when the predetermined bit is set to "2", the second loop 150 may perform a duty correction operation until a 2-bit clock is added. However, the predetermined bit according to an embodiment is not limited thereto and may be set so that duty correction is performed until a bit having a different value is added.

When it is determined that the corrected duty satisfies the predetermined condition, the memory system 10 according to an embodiment may deactivate the second duty correction (i.e., the second duty correction may be completed) and may activate a third switch and a fourth switch (e.g., may operate the third switch and the fourth switch to each transition from an electrically open state to an electrically closed state) in operation S1140b.

The third switch 160 according to an embodiment may be operable to connect the second loop 150 with the memory device 200 and may control a flow of the data strobe signal DQS. For example, when the second duty correction is completed in the second loop 150, the second loop 150 may generate a second flag signal Flag2 and the third switch 160 may be changed to a closed state. The second flag signal Flag2 according to an embodiment may be a signal representing that the second duty correction is completed. When the third switch 160 according to an embodiment is changed to a closed state, the corrected data strobe signal DQS_N may be transferred to the memory device 200. The corrected data strobe signal DQS_N according to an embodiment may be a data strobe signal DQS on which up to the second duty correction has been performed.

The fourth switch 170 according to an embodiment may be operable to connect an output terminal TX of the buffer chip 100 with the multiplexer 180 on the data signal DQ and may control a flow of the data signal DQ. For example, when the second duty correction is completed in the second loop 150, the fourth switch 170 may be changed to a closed state and may transfer the data signal DQ to the multiplexer 180 through the output terminal TX.

However, when it is determined that the corrected duty does not satisfy the predetermined condition, the memory system 10 according to an embodiment may continuously monitor a duty of the data strobe signal DQS, that is, by returning to operation S1110b.

Figure 12:
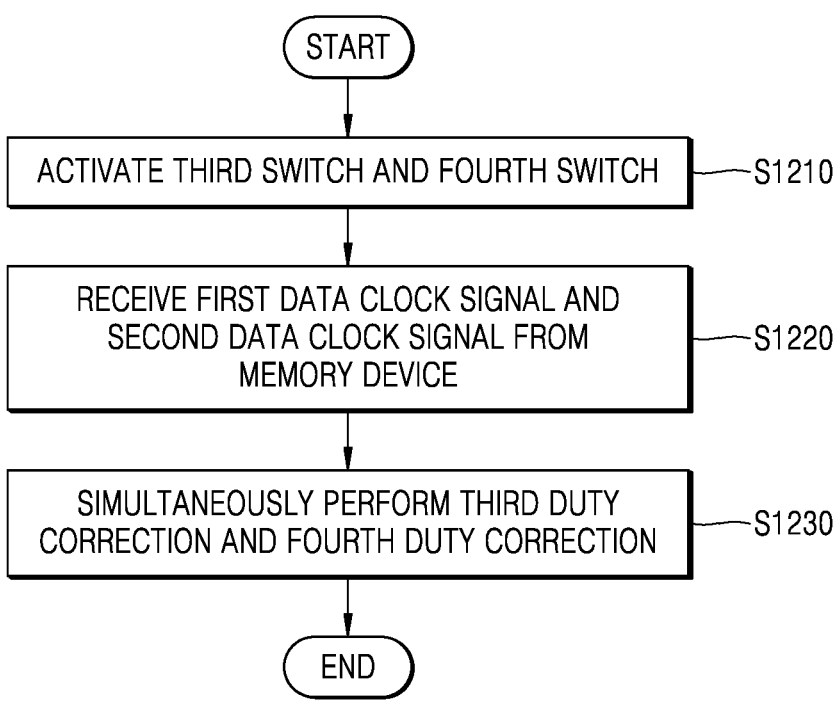
FIG. 12 is a flowchart for describing an operation of each of a third loop and a fourth loop in an operating method of a memory system, according to an embodiment.

FIG. 12 is a flowchart for describing an operation of each of a third loop and a fourth loop in an operating method of a memory system 10, according to an embodiment.

Referring to FIG. 12, the memory system 10 according to an embodiment may activate a third switch and a fourth switch in operation S1210.

When the third switch 160 according to an embodiment is changed to a closed state, the corrected data strobe signal DQS_N may be transferred to the memory device 200. The corrected data strobe signal DQS_N according to an embodiment may be the data strobe signal DQS on which the second duty correction has been performed. When the fourth switch 170 is changed to a closed state, the data signal DQ may be transferred to the memory device 200 through the output terminal TX.

When the third switch and the fourth switch are activated, a first data clock signal and a second data clock signal may be received by the memory device 200 in operation S1220. The first data clock signal according to an embodiment may be the data strobe signal DQS_N on which the second duty correction has been performed, and the second data clock signal may be the corrected data signal DQ_N. The first data clock signal according to an embodiment may be received by a third loop, and the second data clock signal may be received by a fourth loop.

When the first data clock signal and the second data clock signal are received, the memory system 10 according to an embodiment may simultaneously perform the third duty correction and the fourth duty correction in operation S1230.

When the third duty correction according to an embodiment is completed, the third loop 210 may transfer a final data strobe signal DQS_ND to the second sampler 230, and the second sampler 230 may store information about the final data strobe signal DQS_ND received thereby. When the fourth duty correction according to an embodiment is completed, the fourth loop may transfer a final data signal DQ_ND to the second sampler 230, and the second sampler 230 may store information about the final data signal DQ_ND received thereby.

Figure 13:
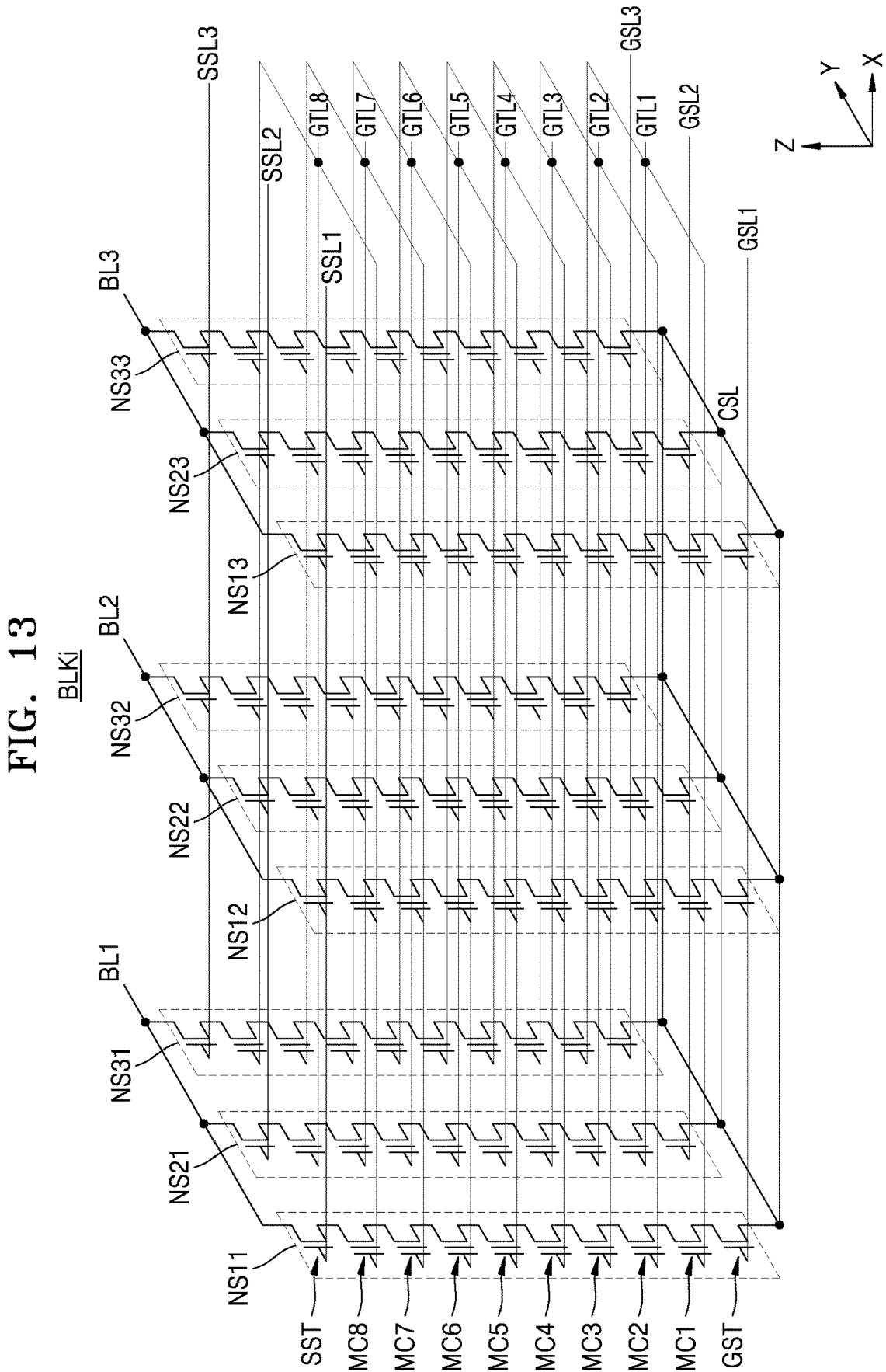
Figure 14:
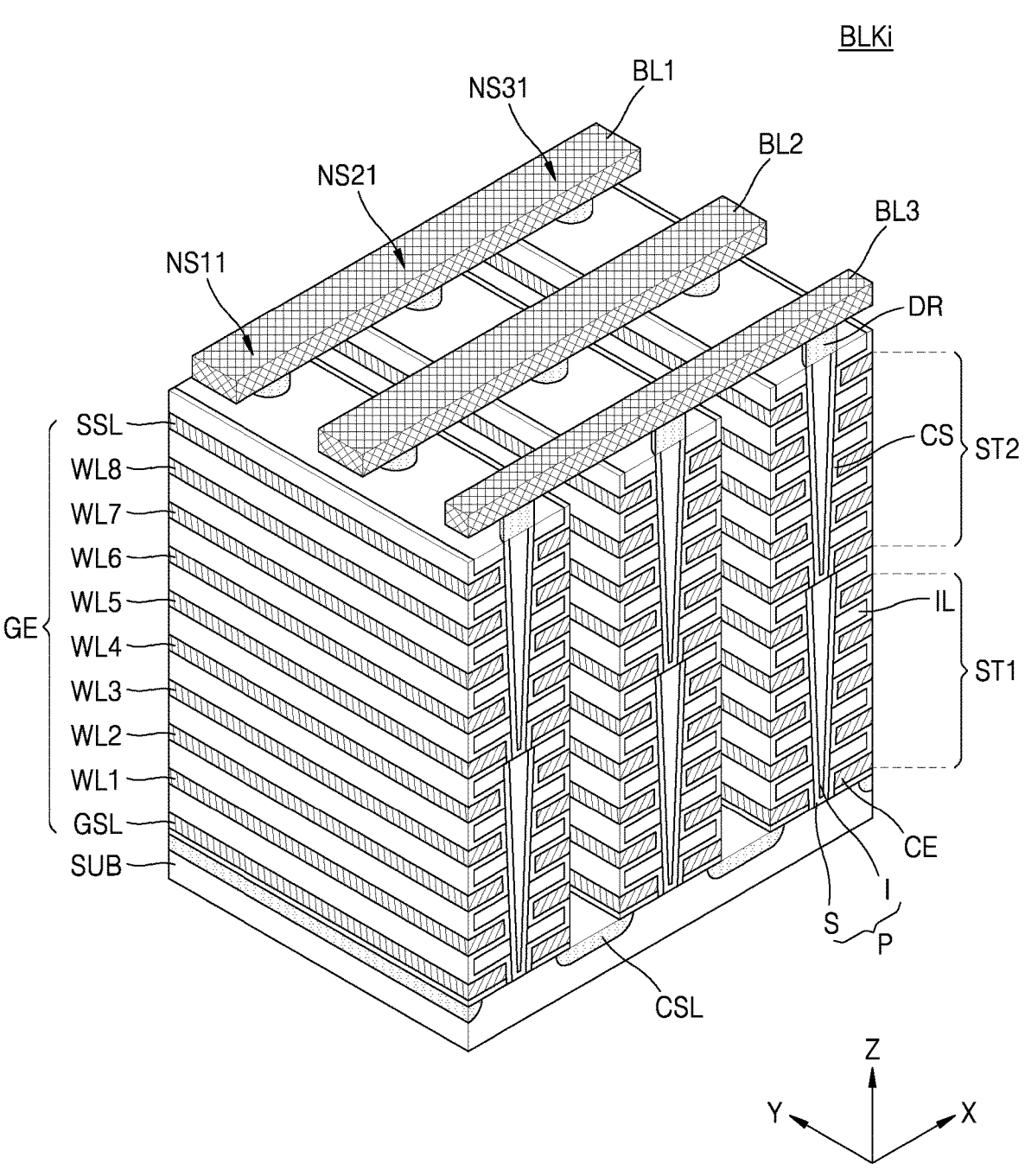
Figure 15:
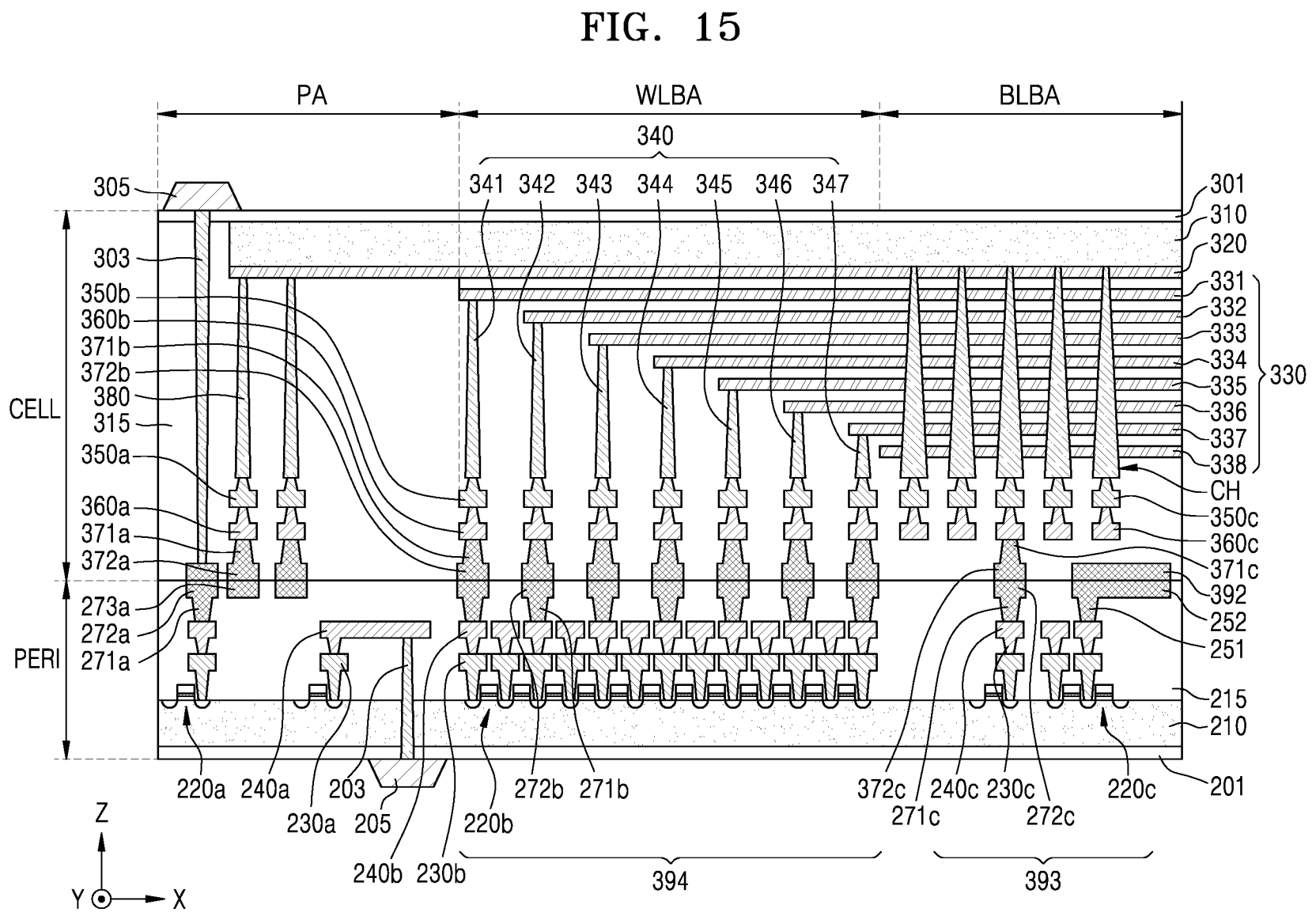

FIGS. 13 to 15 are diagrams for describing a three-dimensional (3D) V-NAND structure applicable to a memory device according to an embodiment.

A first non-volatile memory applicable to a memory device (200 of FIG. 1) may include a plurality of memory blocks. FIGS. 13 and 14 describe a structure of one memory block BLKi of a plurality of memory blocks, and FIG. 15 describes an implementation example of a non-volatile memory.

Referring to FIG. 13, the memory block BLKi may include a plurality of memory NAND strings NS11 to NS33 connected between bit lines BL1 to BL3 and a common source line CSL. Each of the plurality of memory NAND strings NS11 to NS33 may include a string selection transistor SST, a plurality of memory cells MC1 to MC8, and a ground selection transistor GST. For conciseness of illustrating, in FIG. 10, each of the plurality of memory NAND strings NS11 to NS33 is illustrated as including eighth memory cells MC1 to MC8, but is not limited thereto.

The string selection transistor SST may be connected with string selection lines SSL1 to SSL3 corresponding thereto. The memory cells MC1 to MC8 may be respectively connected with gate lines GTL1 to GTL8 corresponding thereto. The gate lines GTL1 to GTL8 may correspond to word lines, and some of the gate lines GTL1 to GTL8 may correspond to a dummy word line. The ground selection transistor GST may be connected with corresponding ground selection line GSL1 to GSL3. The string selection transistor SST may be connected with corresponding bit lines BL1 to BL3, and the ground selection transistor GST may be connected with the common source line CSL.

A gate line (for example, GTL1) having the same height may be connected with word lines in common, and the ground selection line GSL1 to GSL3 may be respectively disconnected from the string selection lines SSL1 to SSL3. In FIG. 13, a memory block BLKi is illustrated as being connected with eight gate lines GTL1 to GTL8 and three bit lines BL1 to BL3, but is not limited thereto.

Referring further to FIG. 14, the memory block BLKi may be formed in a vertical direction with respect to a substrate SUB. Memory cells configuring the memory NAND strings NS11 to NS31 may be stacked on a plurality of semiconductor layers.

The common source line CSL extending in a first direction (a Y-axis direction) may be provided on the substrate SUB. A plurality of insulation layers IL extending in the first direction (the Y-axis direction) may be sequentially provided in a third direction (a Z-axis direction), on a region of the substrate SUB between two adjacent common source lines CSL, and may be apart from one another by a certain distance in the third direction (the Z-axis direction). A plurality of pillars P may be sequentially arranged in the first direction (the Y-axis direction), on a region of the substrate SUB between two adjacent common source lines CSL, and may pass through the plurality of insulation layers IL in the third direction (the Z-axis direction). The plurality of pillars P may pass through the plurality of insulation layers IL and may contact the substrate SUB. A surface layer S of each of the plurality of pillars P may include a silicon material doped as a first conductive type and may function as a channel region.

An inner layer of each pillar P may include an air gap or an insulating material such as silicon oxide. A charge storage layer CS may be provided along the insulation layers IL, the pillars P, and an exposed surface of the substrate SUB, in a region between two adjacent common source lines CSL. The charge storage layer CS may include a gate insulation layer (or referred to as a tunneling insulation layer), a charge trap layer, and a blocking insulation layer. Also, a gate electrode GE such as selection lines GSL and SSL and word lines WL1 to WL8 may be provided on an exposed surface of the charge storage layer CS, in a region between two adjacent common source lines CSL. Drains or drain contacts DR may be respectively provided on the plurality of pillars P. The bit lines BL1 to BL3, which extend in a second direction (an X-axis direction) and are arranged apart from one another by a certain distance in the first direction (the Y-axis direction), may be provided on the drain contacts DR.

As illustrated in FIG. 14, each of the memory NAND strings NS11 to NS31 may be implemented in a structure where a first memory stack ST1 and a second memory stack ST2 are stacked. The first memory stack ST1 may be connected with the common source line CSL, the second memory stack ST2 may be connected with the bit lines BL1 to BL3, and the first memory stack ST1 and the second memory stack ST2 may be stacked to share a channel hole therebetween.

Referring further to FIG. 15, the non-volatile memory may have a chip to chip (C2C) structure. The C2C structure may denote that an upper chip including a cell region CELL is manufactured on a first wafer, a lower chip including a peripheral circuit region PERI is manufactured on a second wafer which differs from the first wafer, and the upper chip and the lower chip are connected with each other by a bonding process. For example, the bonding process may denote a process of electrically connecting a bonding metal, formed on an uppermost metal layer of the upper chip, with a bonding metal formed on an uppermost metal layer of the lower chip. For example, when a bonding metal includes copper (Cu), the bonding process may be a Cu—Cu bonding process, and the bonding metal may include aluminum (Al) or tungsten (W).

Each of the peripheral circuit region PERI and the cell region CELL of the non-volatile memory may include an external pad bonding region PA, a word line bonding region WLBA, and a bit line bonding region BLBA.

The peripheral circuit region PERI may include a first substrate 210, an interlayer insulation layer 215, a plurality of circuit devices 220a to 220c formed on the first substrate 210, first metal layers 230a to 230c respectively connected with the plurality of circuit devices 220a to 220c, and second metal layers 240a to 240c formed on the first metal layers 230a to 230c. In an embodiment, the first metal layers 230a to 230c may include tungsten which is relatively high in electrical resistivity, and the second metal layers 240a to 240c may include copper which is relatively low in electrical resistivity.

Herein, the first metal layers 230a to 230c and the second metal layers 240a to 240c are illustrated and described, but the inventive concept is not limited thereto and one or more metal layers may be further formed on the second metal layers 240a to 240c. At least some of the one or more metal layers formed on the second metal layers 240a to 240c may include aluminum having electrical resistivity which is lower than that of copper included in the second metal layers 240a to 240c.

The interlayer insulation layer 215 may be disposed on the first substrate 210 to cover the plurality of circuit devices 220a to 220c, the first metal layers 230a to 230c, and the second metal layers 240a to 240c and may include an insulating material such as silicon oxide or silicon nitride.

Lower bonding metals 271*b* and 272*b* may be formed on the second metal layer 240*b* of the word line bonding region WLBA. In the word line bonding region WLBA, the lower bonding metals 271*b* and 272*b* of the peripheral circuit region PERI may be electrically connected with upper bonding metals 371*b* and 372*b* of the cell region CELL by a bonding process, and the lower bonding metals 271*b* and 272*b* and the upper bonding metals 371*b* and 372*b* may include aluminum, copper, or tungsten.

The cell region CELL may provide at least one memory block. The cell region CELL may include a second substrate 310 and a common source line 320. A plurality of word lines 331 to 338 (330) may be stacked on the second substrate 310 in a direction (the Z-axis direction) perpendicular to an upper surface of the second substrate 310. String selection lines and ground selection lines may be disposed on the word lines 330, and the plurality of word lines 330 may be disposed between the string selection lines and the ground selection lines.

In the bit line bonding region BLBA, a channel structure CH may extend in the direction (the Z-axis direction) perpendicular to the upper surface of the second substrate 310 and may pass through the word lines 330, the string selection lines, and the ground selection lines. The channel structure CH may include a data storage layer, a channel layer, and a buried insulation layer, and the channel layer may be electrically connected with the first metal layer 350*c* and the second metal layer 360*c*. For example, the first metal layer 350*c* may be a bit line contact, and the second metal layer 360*c* may be a bit line. In an embodiment, the bit line 360*c* may extend in the first direction (the Y-axis direction) parallel to the upper surface of the second substrate 310.

A region where the channel structure CH and the bit line 360*c* are disposed may be defined as the bit line bonding region BLBA. The bit line 360*c* may be electrically connected with the circuit devices 220*c* providing the page buffer 393 in the peripheral circuit region PERI in the bit line bonding region BLBA. For example, the bit line 360*c* may be connected with the upper bonding metals 371*c* and 372*c* in the peripheral circuit region PERI, and the upper bonding metals 371*c* and 372*c* may be connected with the lower bonding metals 271*c* and 272*c* connected with the circuit devices 220*c* of the page buffer 393.

In the word line bonding region WLBA, the word lines 330 may extend in the second direction (the X-axis direction) which is perpendicular to the first direction and is parallel to the upper surface of the second substrate 310 and may be connected with a plurality of cell contact plugs 341 to 347 (340). The word lines 330 and the cell contact plugs 340 may be connected with one another in pads which are provided as at least some of the word lines 330 extend by different lengths in the second direction. The first metal layer 350*b* and the second metal layer 360*b* may be sequentially connected with each other on the cell contact plugs 340 connected with the word lines 330. The cell contact plugs 340 may be connected with the peripheral circuit region PERI through the upper bonding metals 371*b* and 372*b* of the cell region CELL and the lower bonding metals 271*b* and 272*b* of the peripheral circuit region PERI, in the word line bonding region WLBA.

The cell contact plugs 340 may be electrically connected with the circuit devices 220*b* providing a row decoder 394 in the peripheral circuit region PERI. In an embodiment, an operation voltage of each of the circuit devices 220*b* configuring the row decoder 394 may differ from an operation voltage of each of the circuit devices 220*c* configuring the page buffer 393. For example, an operation voltage of each of the circuit devices 220*c* configuring the page buffer 393 may be greater than that of each of the circuit devices 220*b* configuring the row decoder 394.

A common source line contact plug 380 may be disposed in the external pad bonding region PA. The common source line contact plug 380 may include a conductive material such as metal, a metal compound, or polysilicon and may be electrically connected with the common source line 320. The first metal layer 350*a* and the second metal layer 360*a* may be sequentially stacked on the common source line contact plug 380. For example, the common source line contact plug 380, the first metal layer 350*a*, and the second metal layer 360*a* may be defined as the external pad bonding region PA.

Furthermore, input/output (I/O) pads 205 and 305 may be disposed in the external pad bonding region PA. A lower insulation layer 201 covering a lower surface of the first substrate 210 may be formed under the first substrate 210, and a first I/O pad 205 may be formed on the lower insulation layer 201. The first I/O pad 205 may be connected with at least one of the plurality of circuit devices 220*a* to 220*c*, disposed in the peripheral circuit region PERI, through a first I/O contact plug 203 and may be separated from the first substrate 210 by the lower insulation layer 201. Also, a side insulation layer may be disposed between the first I/O contact plug 203 and the first substrate 210 and may electrically disconnect or isolate the first I/O contact plug 203 from the first substrate 210.

An upper insulation layer 301 covering the upper surface of the second substrate 310 may be formed on the second substrate 310, and a second I/O pad 305 may be formed on the upper insulation layer 301. The second I/O pad 305 may be connected with at least one of the plurality of circuit devices 220*a* to 220*c*, disposed in the peripheral circuit region PERI, through a second I/O contact plug 303. In an embodiment, the second I/O pad 305 may be electrically connected with the circuit device 220*a*.

According to embodiments, the second substrate 310 and the common source line 320 may not be disposed in a region where the second I/O contact plug 303 is provided. Also, the second I/O pad 305 may not overlap the word lines 330 in the third direction (the Z-axis direction). The second I/O contact plug 303 may be electrically isolated from the second substrate 310 in a direction parallel to the upper surface of the second substrate 310, and moreover, may pass through the interlayer insulation layer 315 of the cell region CELL and may be connected with the second I/O pad 305.

According to embodiments, the first I/O pad 205 and the second I/O pad 305 may be selectively formed. For example, the non-volatile memory may include only the first I/O pad 205 disposed on the first substrate 210, or may include only the second I/O pad 305 disposed on the second substrate 310. Alternatively, the non-volatile memory may include all of the first I/O pad 205 and the second I/O pad 305.

In the external pad bonding region PA and the bit line bonding region BLBA included in each of the cell region CELL and the peripheral circuit region PERI, a metal pattern of an uppermost metal layer may be provided as a dummy pattern, or the uppermost metal layer may be empty.

In the non-volatile memory, the lower metal pattern 273*a* having the same shape as that of the upper metal pattern 372*a* of the cell region CELL may be formed in an uppermost metal layer of the peripheral circuit region PERI based on the upper metal pattern 372*a* formed in an uppermost metal layer of the cell region CELL, in the external pad bonding region PA. The lower metal pattern 273*a* formed in the uppermost metal layer of the peripheral circuit region PERI may not be connected with a separate contact in the peripheral circuit region PERI. Likewise, the upper metal pattern 372a having the same shape as that of the lower metal pattern 273a of the peripheral circuit region PERI may be formed in an uppermost metal layer of the cell region CELL based on the lower metal pattern 273a formed in an uppermost metal layer of the peripheral circuit region PERI, in the external pad bonding region PA.

The lower bonding metals 271b and 272b may be formed on the second metal layer 240b of the word line bonding region WLBA. In the word line bonding region WLBA, the lower bonding metals 271b and 272b of the peripheral circuit region PERI may be electrically connected with the upper bonding metals 371b and 372b of the cell region CELL by a bonding process.

Also, the upper metal pattern 392 having the same shape as that of the lower metal pattern 252 of the peripheral circuit region PERI may be formed in an uppermost metal layer of the cell region CELL based on the lower metal pattern 252 formed in an uppermost metal layer of the peripheral circuit region PERI, in the bit line bonding region BLBA. A contact may not be formed on the upper metal pattern 392 formed in the uppermost metal layer of the cell region CELL.

Figure 16:
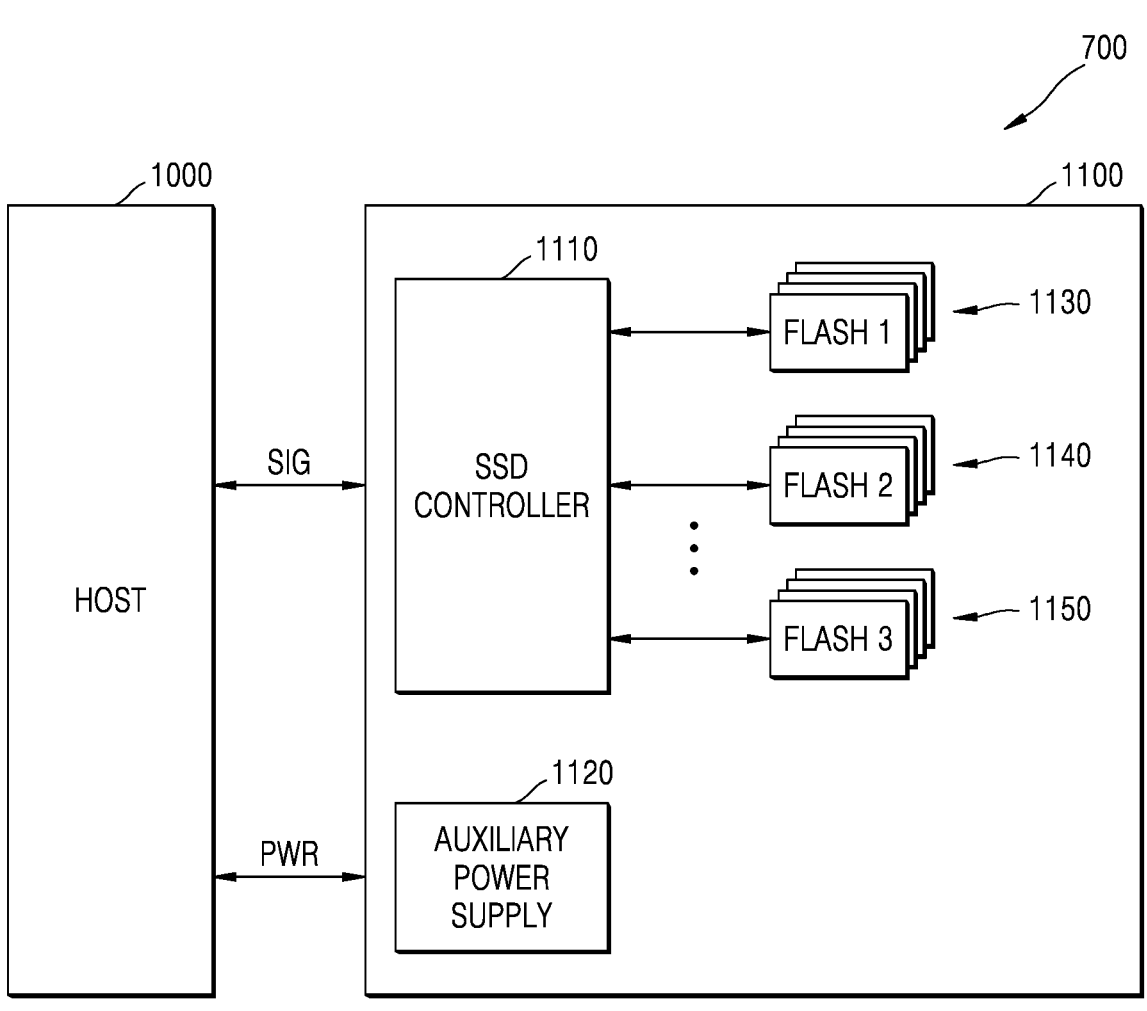
FIG. 16 is a block diagram illustrating an example where a memory device according to an embodiment is applied to a solid state drive (SSD) system.

FIG. 16 is a block diagram illustrating an example where a memory device according to an embodiment is applied to an SSD system 700.

Referring to FIG. 16, the SSD system 700 may include a host 1000 and an SSD 1100. The SSD 1100 may transfer and receive a signal to and from the host 1000 through a signal connector and may be supplied with power through a power connector. The SSD 1100 may include an SSD controller 1110, an auxiliary power supply 1120, and memory devices 1130 to 1150. Each of the memory devices 1130, 1140, and 1150 may be a NAND flash memory device of a vertical stack type. In this case, the SSD 1100 may be implemented by using the embodiments described above with reference to FIGS. 1 to 14. That is, each of the memory devices 1130 to 1150 included in the SSD 1100 may include a plurality of cell blocks, and at least one of the plurality of cell blocks may correspond to a special cell block.

Figure 17:
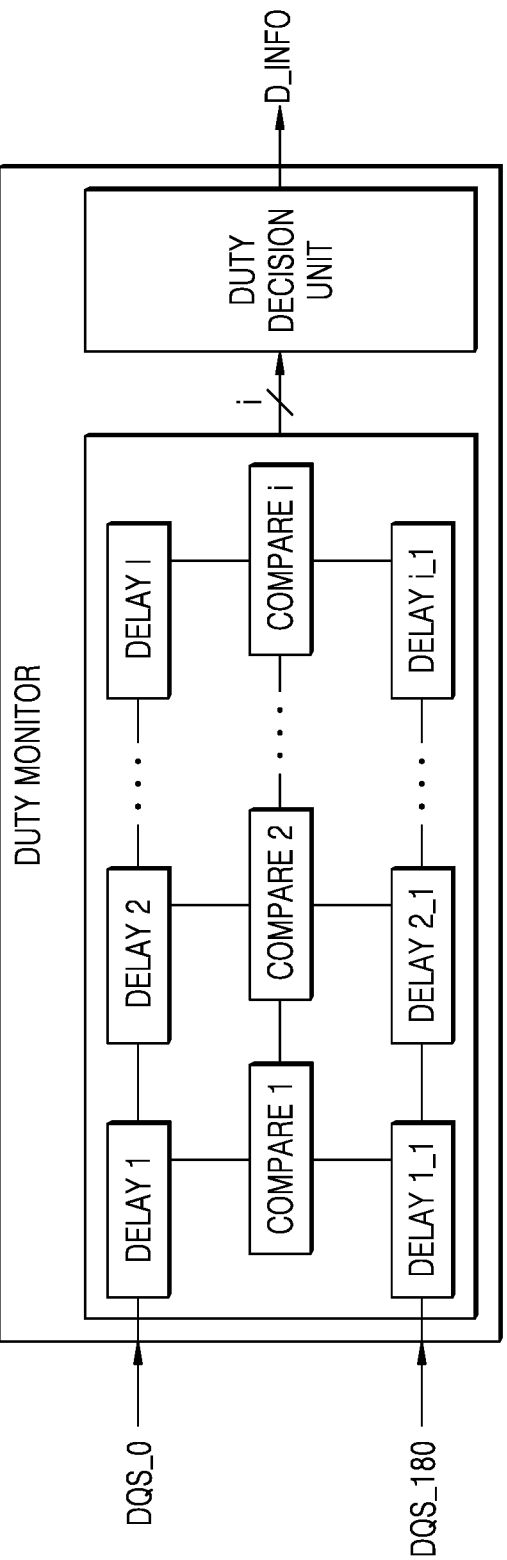
FIG. 17 is a block diagram illustrating an implementation example of a duty monitor according to an embodiment.

FIG. 17 is a block diagram illustrating an implementation example of a duty monitor according to an embodiment.

Referring to FIG. 17, a write clock provided from a memory controller (for example, an external write clock EXT_WCK) may be used for an internal processing operation performed in a memory device, and one or more internal write clocks may be generated from the external write clock EXT_WCK.

Furthermore, a duty monitoring operation according to embodiments may be performed by using the internal write clocks WCK/2_0 and WCK/2_90 (e.g., DQS_0 and DQS_180). For example, the internal write clocks WCK/2_0 and WCK/2_90 may be provided to the duty monitor, and the duty monitor may include a plurality of delay circuits (DELAY1 to DELAYi, DELAY1_1 to DELAYi_1) and comparators (COMPAREI to COMPAREi). Each of the internal write clocks WCK/2_0 and WCK/2_90 may be sequentially delayed through a plurality of delay circuits, and clock signals output through the delay circuits may be compared with one another.

For example, a duty of the external write clock EXT_WCK may be monitored by comparing logic states of the internal write clocks WCK/2_0 and WCK/2_90 while adjusting the delay of the internal write clocks WCK/2_0 and WCK/2_90. A comparison result of when a logic high period is greater than a logic low period in the external write clock EXT_WCK may have a value which differs from a value of a comparison result of when the logic low period is greater than the logic high period. Also, comparison results of i number of comparators may be provided to a duty decision unit, and the duty decision unit may generate monitoring information D_Info according to the embodiment described above by using the comparison results.

Figure 18:
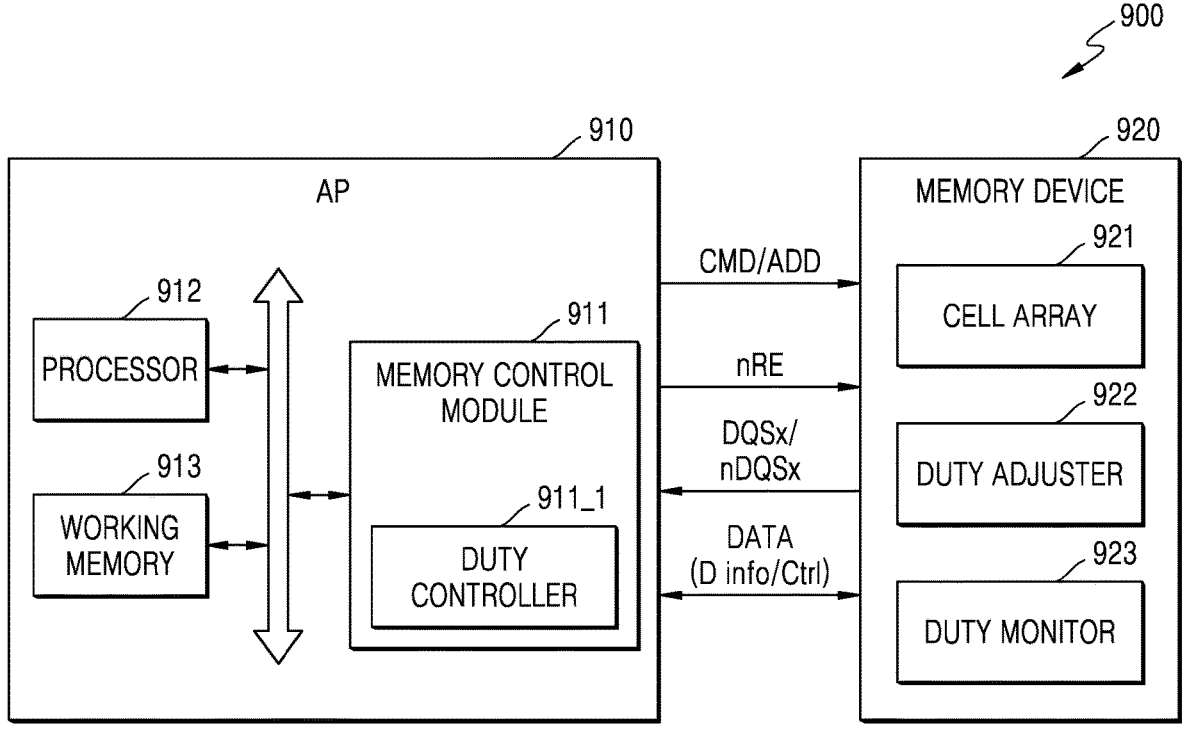
FIG. 18 is a block diagram illustrating an electronic device including a memory system according to an embodiment.

FIG. 18 is a block diagram illustrating an electronic device 900 including a memory system according to an embodiment.

The electronic device 900 may correspond to a data processing system and may include an application processor 910 and a memory device 920. The application processor 910 may be implemented as a system on chip (SoC). The SoC may include a system bus (not shown) to which a protocol having a standard bus protocol is applied, and moreover, may include various kinds of intellectual properties (IPs) connected with the system bus. An advanced microcontroller bus architecture (AMBA) protocol of Advanced RISC Machine (ARM) may be applied as a standard bus protocol. Bus types of the AMBA protocol may include advanced high-performance bus (AHB), advanced peripheral bus (APB), advanced extensible interface (AXI), AXI4, and AXI coherency extensions (ACE). In addition, other types of protocol, such as uNetwork of SONICs Inc., CoreConnect of IBM Inc., or open core protocol of OCP-IP, may be applied to the system bus.

The application processor 910 may include a memory control module 911, and a processor 912 and a working memory 913 of a central processing unit. In FIG. 16, one processor 912 is illustrated, or the application processor 910 may include two or more various kinds of processors. Also, the working memory 913 may store instructions for controlling an overall operation of the electronic device 900. Also, the application processor 910 may be an element which controls a modem communication function and may further include a modem processor (not shown), and in this case, the application processor 910 may be referred to as ModAP.

According to the embodiments described above, the memory controller 911 may include a duty controller 911_1, and the memory device 920 may include a cell array 921, a duty adjuster 922, and a duty monitor 923. The memory device 920 may perform a duty monitoring operation according to the embodiments described above, and the duty monitor 923 may monitor a duty of a write clock WCK and/or a duty of a read clock RDQS, and as a result thereof, may generate monitoring information D_Info. Also, according to the embodiments described above, the memory controller 911 may generate a control signal Ctrl for optimizing a duty of a clock signal, based on the monitoring information D_Info, and the duty adjuster 922 of the memory device 920 may perform a duty adjustment operation in response to the control signal Ctrl.

Hereinabove, exemplary embodiments have been described in the drawings and the specification. Embodiments have been described by using the terms described herein, but this has been merely used for describing the inventive concept and has not been used for limiting a meaning or limiting the scope of the inventive concept defined in the following claims. Therefore, it may be understood by those of ordinary skill in the art that various modifications and other equivalent embodiments may be implemented from the inventive concept.

Accordingly, the spirit and scope of the inventive concept may be defined based on the scope of the following claims.

While the inventive concept has been particularly shown and described with reference to embodiments thereof, it will be understood that various changes in form and details may be made therein without departing from the scope of the following claims.

What is claimed is:

1. A memory system comprising:
a memory device comprising a plurality of non-volatile memories;
a buffer chip connected with the plurality of non-volatile memories; and
a memory controller connected with the buffer chip and configured to provide a data strobe signal and a data signal to the buffer chip,
wherein the buffer chip comprises:
a sampler circuit;
a multiplexer;
a first loop coupled to the sampler circuit and configured to perform first monitoring on the data strobe signal and perform first duty correction on the data strobe signal based on the first monitoring; and
a second loop coupled to the multiplexer and configured to, responsive to the first duty correction, perform second monitoring on the data strobe signal and perform second duty correction on the data strobe signal based on the second monitoring;
wherein the buffer chip is configured to store first duty correction information and second duty correction information for at least one of the plurality of non-volatile memories based on the first duty correction and the second duty correction, respectively.

2. The memory system of claim 1, wherein the memory device comprises:
a third loop configured to, responsive to the second duty correction, perform third monitoring on the data strobe signal and perform third duty correction on the data strobe signal based on the third monitoring; and
a fourth loop configured to perform fourth duty correction on the data signal, and
the memory device is configured to store third duty correction information and fourth duty correction information for at least one of the plurality of non-volatile memories based on the third duty correction and the fourth duty correction, respectively.

3. The memory system of claim 2, wherein the third loop and the fourth loop are configured to simultaneously perform the third duty correction on the data strobe signal and the fourth duty correction on the data signal.

4. The memory system of claim 1, wherein the buffer chip comprises:
a first switch configured to be closed to connect the first loop with the second loop and control a flow of the data strobe signal; and
a second switch configured to be closed to connect the sampler circuit with the multiplexer and control a flow of the data signal,
wherein the buffer chip is configured to, responsive to the first duty correction, close the first switch and the second switch.

5. The memory system of claim 1, wherein the buffer chip comprises:
a third switch configured to be closed to connect the second loop with the memory device and control a flow of the data strobe signal; and
a fourth switch configured to be closed to connect the multiplexer with an output terminal of the buffer chip and control a flow of the data signal, wherein the buffer chip is configured to, responsive to the second duty correction, close the third switch and the fourth switch.

6. The memory system of claim 1, wherein the first loop comprises a first data strobe signal monitor, a first data strobe signal compensator, a first counter, and a first register,
the second loop comprises a second data strobe signal monitor, a second data strobe signal compensator, a second counter, and a second register, and
the first register and the second register are configured to store the first duty correction information and the second duty correction information, respectively.

7. The memory system of claim 2, wherein the third loop comprises a third data strobe signal monitor, a third data strobe signal compensator, a third counter, and a third register,
the fourth loop comprises a data signal monitor, a data signal compensator, a fourth counter, and a fourth register,
the data signal compensator is configured to perform compensation on the data signal based on a reference voltage, and
the third register and the fourth register are configured to store the third duty correction information and the fourth duty correction information, respectively.

8. The memory system of claim 1, wherein, responsive to selecting at least one non-volatile memory from among the plurality of non-volatile memories,
the buffer chip is configured to provide data signal duty correction information and data strobe signal duty correction information for the at least one non-volatile memory that was selected.

9. An operating method of a memory system including a buffer chip connected with each of a plurality of non-volatile memories of a memory device, and a memory controller connected with the buffer chip and configured to provide a data strobe signal and a data signal thereto, the operating method comprising:
performing first monitoring on the data strobe signal, and performing first duty correction on the data strobe signal based on the first monitoring;
responsive to the first duty correction, performing second monitoring on the data strobe signal, and performing second duty correction on the data strobe signal based on the second monitoring; and
storing first duty correction information and second duty correction information for at least one of the plurality of non-volatile memories based on the first duty correction and the second duty correction, respectively.

10. The operating method of claim 9, further comprising:
responsive to the second duty correction, performing third monitoring on the data strobe signal, and performing third duty correction on the data strobe signal based on the third monitoring;
performing fourth duty correction on the data signal; and
storing third duty correction information and fourth duty correction information for at least one of the plurality of non-volatile memories based on the third duty correction and the fourth duty correction, respectively.

11. The operating method of claim 10, wherein the performing of the third duty correction and the performing of the fourth duty correction comprise simultaneously performing the third duty correction and the fourth duty correction.

12. The operating method of claim 9, wherein the performing of the first duty correction comprises connecting a first loop with a second loop using a closed state of a first switch to control a flow of the data strobe signal, the performing of the second duty correction comprises connecting a data signal sampler with a multiplexer using a closed state of a second switch to control a flow of the data signal, and the operating method further comprises, responsive to the first duty correction, operating the first switch and the second switch to the closed states, respectively.

13. The operating method of claim 10, wherein the performing of the third duty correction comprises connecting a second loop with the memory device using a closed state of a third switch to control a flow of the data strobe signal, the performing of the fourth duty correction comprises connecting a multiplexer with an output terminal of the buffer chip using a closed state of a fourth switch to control a flow of the data signal, and the operating method further comprises, responsive to the second duty correction, operating the third switch and the fourth switch to the closed states, respectively.

14. The operating method of claim 9, further comprising, responsive to selecting at least one non-volatile memory from among the plurality of non-volatile memories, providing data signal duty correction information and data strobe signal duty correction information for the at least one non-volatile memory that was selected.

15. An interface circuit of a memory system, the interface circuit configured to connect a memory device including a plurality of non-volatile memories with a memory controller configured to provide a data strobe signal and a data signal to the memory device, the interface circuit comprising:

a first loop configured to perform first monitoring on the data strobe signal, and perform first duty correction on the data strobe signal based on the first monitoring; and a second loop configured to, responsive to the first duty correction, perform second monitoring on the data strobe signal, and perform second duty correction on the data strobe signal based on the second monitoring, wherein the first loop is configured to be coupled to a data signal sampler included in a buffer chip, and the second loop is configured to be coupled to a multiplexer of the buffer chip, and wherein the interface circuit is configured to store first duty correction information and second duty correction information for at least one of the plurality of non-volatile memories based on the first duty correction and the second duty correction, respectively.

16. The interface circuit of claim 15, wherein the memory device comprises:

a third loop configured to, responsive to the second duty correction, perform third monitoring on the data strobe signal and perform third duty correction on the data strobe signal based on the third monitoring; and a fourth loop configured to perform fourth duty correction on the data signal, and the memory device is configured to store third duty correction information and fourth duty correction information for at least one of the plurality of non-volatile memories based on the third duty correction and the fourth duty correction, respectively.

17. The interface circuit of claim 16, wherein the third loop and the fourth loop are configured to simultaneously perform the third duty correction and the fourth duty correction.

18. The interface circuit of claim 15, further comprising:

a first switch configured to be closed to connect the first loop with the second loop and control a flow of the data strobe signal; and a second switch configured to be closed to connect a data signal sampler with the multiplexer and control a flow of the data signal, wherein the interface circuit is configured to, responsive to the first duty correction, close the first switch and the second switch.

19. The interface circuit of claim 15, further comprising:

a third switch configured to be closed to connect the second loop with the memory device and control a flow of the data strobe signal; and a fourth switch configured to be closed to connect the multiplexer with an output terminal of the buffer chip and control a flow of the data signal, and the interface circuit is configured to, responsive to the second duty correction, close the third switch and the fourth switch.

20. The interface circuit of claim 15, wherein the first loop comprises a first data strobe signal monitor, a first data strobe signal compensator, a first counter, and a first register, the second loop comprises a second data strobe signal monitor, a second data strobe signal compensator, a second counter, and a second register, and the first register and the second register are configured to store the first duty correction information and the second duty correction information, respectively.

* * * * *